US006549017B2

(12) United States Patent
Coffeen

(10) Patent No.: US 6,549,017 B2
(45) Date of Patent: Apr. 15, 2003

(54) SYSTEM AND METHOD FOR ON-LINE IMPULSE FREQUENCY RESPONSE ANALYSIS

(75) Inventor: Larry T. Coffeen, Jackson, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 0 days.

(21) Appl. No.: 09/848,921

(22) Filed: May 3, 2001

(65) Prior Publication Data

US 2002/0011848 A1 Jan. 31, 2002

Related U.S. Application Data

(60) Provisional application No. 60/202,349, filed on May 5, 2000.

(51) Int. Cl.[7] .......................... G01R 31/06; G01R 29/00
(52) U.S. Cl. ....................................... 324/547; 324/726
(58) Field of Search ............................... 324/547, 546, 324/127, 117 H, 726; 702/58; 323/357, 358; 361/603, 623; 307/17, 82

(56) References Cited

U.S. PATENT DOCUMENTS

| | | | |
|---|---|---|---|
| 4,654,806 A | 3/1987 | Poyser et al. ................ | 364/551 |
| 4,857,856 A | 8/1989 | Coleman et al. ............ | 324/547 |
| 5,455,506 A | 10/1995 | Mimeault et al. ........... | 324/547 |
| 6,369,582 B2 * | 4/2002 | Coffeen ....................... | 324/547 |

OTHER PUBLICATIONS

Working Copy of Proceedings, International Symposium on Digital Techniques in High–Voltage Measurements, Toronto, Canada, Oct. 28–30, 1991, CIGRE Study Committee 33, WG 03, IEEE Power Engineering Society, Power Systems Instrumentation and Measurements Committee.
Example of State–Of–The–Art Public Doman, Feb. 22, 2000, Substation Equipment Diag. Conference VIII, Comparison of Two FRA Methods to Detect Transformer Winding Movement, R.J. Denis, S.K. An, Bonnevile Power Administration, Vancouver, Washington, J. Vandermaar, M. Wang, Powertech Labs, Vancouver, British Columbia.

* cited by examiner

Primary Examiner—Christine Oda
Assistant Examiner—James Kerveros
(74) Attorney, Agent, or Firm—Thomas, Kayden, Horstemeyer & Risley, LLP

(57) ABSTRACT

The on-line winding test unit determines a characteristic signature of a monitored winding(s) in a transformer, generator, or the like. A sensor detects incoming pulses, originating elsewhere on the energy delivery system, applied to the winding. A sensor detects output pulses after each input pulse has propagated through the winding. Data corresponding to the input and output pulses are stored. A processor computes the spectral densities of the data records. The logic then computes the characteristic signature, H(f), for the winding such that H(f) equals the average of Gxy divided by the average of Gxx for the valid data. Coherence is used to determine a valid H(f). A comparison of the H(f)'s over elapsed time using an error function indicates winding deformation or displacement.

35 Claims, 14 Drawing Sheets

SYSTEM AND METHOD FOR ON-LINE IMPULSE FREQUENCY RESPONSE ANALYSIS

CLAIM OF PRIORITY

This document claims priority to and the benefit of the filing date of co-pending and commonly assigned provisional application entitled "The Application Of An Off-Line Power Transformner Low Voltage Impulse Frequency Response Analysis (LVIFRA) Technique Using Spectral Density Estimates Calculations And A Non-Recurrent Surge Pulse Source," assigned Ser. No. 60/202,349, filed May 5, 2000, which i hereby incorporated herein by reference.

CROSS-REFERENCE TO RELATED APPLICATIONS

This application is related to co-pending and commonly assigned U.S patent application Ser. No. 09/848,861 entitled "SYSTEM AND METHOD FOR OFF-LINE IMPULSE FREQUENCY RESPONSE ANALYSIS TEST" filed on even date herewith, which is entirely incorporated herein by reference.

TECHNICAL FIELD

The present invention relates generally to energy delivery systems, and more particularly, to a system and method for testing winding and winding connection deformations and/or displacements in a transformer.

BACKGROUND OF THE INVENTION

Electric utilities and other organizations are responsible for supplying an economic, reliable and safe source of electricity. Three major components are employed in an energy delivery system to provide the electricity to the end user, the generator, the transmission line and the transformer.

Generators are rotating machines operated in a manner such that electricity is created when mechanical energy is used to rotate the generator shaft. A generator rotor is coupled to the shaft, and when the shaft is rotated, thereby rotating the rotor, a voltage and current is caused in the generator stator. One typical form of mechanical energy used to generate electricity is steam, which is passed through a turbine that forces the generator shaft to rotate. Steam is often created by boiling water using coal, natural gas or nuclear fission heat sources. Or, steam may be taken directly from naturally occurring geothermal sources. Other sources of mechanical power employed for rotating a generator rotor may also include hydroelectric power or wind power. Since the end user of the electricity is rarely located near a generator, the electricity generated by the generator must be "transported" to the end user.

The second major component employed in an energy delivery system is the transmission line. Transmission lines consist of a grouping of wires which connect the generator to the end user. The "amount" of electricity that a transmission line can carry depends primarily upon the diameter of and number of the conductors (wires) used on the transmission line, and the voltage at which the transmission line is operated at. Typically, transmission lines from the generators employ a relatively high voltage so that a large amount of electricity is economically and reliably transported over long distances to locations where large concentrations of end users are found, such as a city or a large industrial manufacturing plant. Examples of extra high voltage (EHV) and intermediate transmission voltages employed in the industry include, but are not limited to, 500 kilo-volts (kV), 230 kV, 138 kV, 115 kV, 69 kV and 46 kV. Typically, lower transmission line voltages are employed on the transmission line distribution system (such as, but not limited to, 25 kV, 20 kV, 13.8 kV, 12 kV, 4 kV, 480V and 240V) to provide energy to the end user's premises connection point.

The third major component employed in an energy delivery system is the transformer. The transformer is a device that changes voltage. Generally, voltage from the generator is a lower voltage than used by the transmission lines that transmit the electricity to the end user. Furthermore, the voltage used by the end user is much lower than voltage used by the transmission lines. Thus, the transformer couples elements of an energy delivery system that employ different voltages.

For example, two voltages typically found in a home are 240 volts and 120 volts. An EHV 500 kV transmission line may be delivering power to a city that employs a 230 kV transmission line system to deliver energy to a 13.8 kV distribution system. A 500/230 kV transformer changes voltage from 500 kV to 230 kV, thereby allowing two transmission lines having different operating voltages (500 kV and 230 kV) to be coupled together. Such a transformer has at least two terminals, a 500 kV terminal and a 230 kV terminal. Similarly, a 13.8 kV/240V/120V transformer may be used to convert voltage of the 13.8 kV distribution system to a voltage used in the end user's home or office. Thus, transformers allow the various voltage generators, transmission lines and distribution lines to be coupled to a home, office or other facility where the end user will be using the electricity.

Transformers come in many different sizes, shapes and constructions. Typically, transformer size (rating) is specified as the product of the maximum voltage and current, as measured from one side of the transformer, that the transformer is capable of converting at a particular operating condition. Such operating conditions include temperature and/or altitude. For example, a 500/230 kV transformer may be rated at 300 MVA (3,000 kilo-volt-amps) when operating at sea level and at 65° Celsius rise above ambient. Transformers may be constructed as separately insulated winding transformers or auto transformers, and as single phase or multiple phase transformers. The operating voltages, ratings and winding types of transformers employed in the industry, well known to one skilled in the art, are too numerous to describe in detail here other than to the extent necessary to understand the present deficiencies in the prior art.

All transformers, independent of size, rating and operating voltage, have several common characteristics. First, the transformer is constructed from one or more windings, each winding having a plurality of individual coils arranged and connected in an end-to-end fashion. In some transformers, the winding is made by wrapping a wire around a laminated solid member, called a core. Alternatively, there may be no core. However, in all transformers, the individual windings must be electrically isolated from each other. An insulation material is wrapped around the wires such that when the plurality of coils are made, the metal wires of each winding are physically and electrically separated, or insulated, from each other. Insulation materials wrapped around the windings may vary. Paper, impregnated with oil, is often used. Other types of transformers may use only paper, or may use another suitable material such as a polymeric compound.

Maintaining the electrical insulation between the windings is absolutely essential for the proper operation of a transformer. In the event that the electrical insulation is breached, such that electricity passes from one winding coil across the breach to another winding coil, special protective devices will operate to disconnect the transformer from the electrical system. The devices, by removing electricity applied to the transformer, interrupt the undesirable current flow through the insulation breach to minimize damage to the transformer. This condition is commonly referred to in the industry as a transformer fault.

Transformer faults are undesirable for at least two major reasons. First, end users may become separated from the energy delivery system, thereby loosing their electrical service. Second, transformer faults may result in large magnitudes of current flow, known as fault current, across the breach and through the transformer windings. Also, faults occurring on the energy delivery system at locations relatively close to the transformer may result in large fault currents flowing through the transformer. Often, fault current may be orders of magnitude greater than the highest level of normal operating current that the transformer was designed to carry. Such fault currents may cause severe physical damage to the transformer. For example, a fault current may physically bend portions of the transformer winding (winding deformation) and/or move the windings out of their original position in the transformer (winding displacement). Such winding deformation and/or displacement can cause over-voltage stresses on portions of the winding insulation and exacerbate the process of the naturally occurring deterioration of the winding insulation that occurs over a period of time. The fault current may further increase damage to the insulation, or damage insulation of adjacent windings, thereby increasing the magnitude and severity of the fault. In the most extreme cases, the fault current may cause an ignition in the transformer oil, resulting in a breach of the transformer casing and a subsequent fire or explosion.

Therefore, it is desirable to ensure the integrity of the transformer winding insulation. Once a transformer fault occurs, it is usually too late to minimize transformer damage and to reduce the period of electrical outage. The electric utility industry takes a variety of precautionary steps to ensure the integrity of winding insulation in transformers. One important precautionary step includes periodic testing of the transformer. Various tests are used to predict a probability of a future fault. One test commonly employed in the industry to detect winding deformation and/or displacement is the low voltage impulse test.

To perform a low voltage impulse test according to prior art methods, requires that the transformer be de-energized. The transformer is de-energized by physically isolating the transformer from the energy delivery system. After the test apparatus is coupled to the transformer, an electrical pulse is applied to one terminal of a transformer. That is, a signal or pulse is applied to a selected input winding of the transformer. The signal or pulse on a selected output side of the transformer (output winding) is then measured. The input and output signals or pulses are analyzed using a variety of techniques. One analysis technique is to perform a frequency response analysis (FRA) which measures one characteristic of the input and output signals over a predetermined frequency range. One commonly employed technique is to process the measured input and output signals or pulses by applying a fast Fourier transform (FFT) to the signals. The FFT of the output signal is divided by the FFT of the input signal and the resultant admittance, as a function of frequency, may be plotted for the transformer. The input signal or input pulse may be applied to the high voltage, low voltage, neutral or other suitable terminal that is available on the transformer. The output signal is taken from another selected terminal on the transformer. For example, a low voltage pulse is applied to the high voltage terminal of the transformer winding and the output pulse is measured on the low voltage terminal of the transformer. Such a test is commonly known as a low voltage impulse test because the voltage of the applied input signal or pulse is much less than the impulse voltages used to test for dielectric integrity in a high voltage laboratory or at the transformer manufacturing site. When a series of identical pulses are applied to the transformer winding, in accordance with prior art transformer testing procedures, and the resultant measurements are averaged together, the resultant plot is often referred to as the transfer function or characteristic signature of the transformer winding configuration being tested.

In a static situation, a test engineer could reasonably expect that the characteristic signature of the transformer winding would not significantly change with time. For example, the test engineer could reasonably expect that a transformer winding tested one year after being placed in service, assuming that nothing has changed within the transformer during that year, could be tested and have a transfer function that would substantially match the transfer function taken a year earlier.

However, static conditions rarely occur in the field. Each time current flow is adjusted in the transformer, mechanical stress in the windings change. Abrupt changes in current flow can occur when a portion of the electrical transmission system is reconfigured by switching, when lightning strikes the transmission system, or when faults occur on components of the transmission system, that are nearby the transformer. Many other events may also cause abrupt changes in current through the transformer on a regular and frequent basis. This is a basic reality of the operation of the electric system. Transformer windings are designed to accommodate a number of reasonable magnitudes of abrupt current change over the operating life of the transformer. Yet, abrupt current changes in excess of the design limits are occasionally encountered. When these conditions occur, the windings may permanently bend from their original position, hereinafter referred to as winding deformation. Or, the windings may move slightly from their originally installed position, hereinafter referred to as winding displacement. Winding deformation and displacement may stress, crack and/or otherwise impair the insulation around the windings. Furthermore, the impairment caused to the winding insulation by each abrupt change in current is cumulative. That is, the damage is not self-repairing or healing. Eventually, the cumulative damage may become sufficient to cause a breach in the insulation. Then, a fault will occur and the transformer will become damaged, thereby requiring the transformer to be taken out of service for repair or retirement.

Additionally, winding deformation and/or displacement may alter the voltage gradient around the bent portion of the coils. If the winding deformation and/or displacement decreases the gap between two adjacent winding coils, the voltage gradient may become more concentrated around the bend. The increase in the voltage gradient may be sufficient to breach the insulation, thereby causing a fault. Or, the increased voltage gradient may cause a temperature increase around the deformed and/or displaced portion of the coils. The increased temperature increases the rate of degradation of the winding insulation. In an oil filled transformer, the temperature increase may alter the properties of the transformer oil, and possibly result in electrical partial discharge which in turn results in the formation of undesirable gasses.

Thus, periodic testing is performed to determine and/or estimate the amount of cumulative damage to the transformer resulting from the normal (and abnormal) day-to-day operating conditions that the transformer has been subjected to. If the tests indicate potential problems, the transformer can be scheduled for maintenance, or replaced if necessary, in a timely and controlled manner that results in the least disruption in service to the end users. Furthermore, transformers. are very expensive pieces of equipment, thus repairing a transformer before permanent damage occurs is desirable.

Prior art low voltage impulse tests present many unique problems. One problem is that the transformer must be de-energized from the energy delivery system (by physically isolating the transformer). Another significant problem is that a precise, repeatable input testing signal or pulse must be applied to the input terminal of the tested transformer winding when prior art frequency response analysis techniques are used to measure the frequency response of the transformer winding. If the applied input test signals/pulses are not identical to each other, the resultant characteristic signature of the tested transformer windings will not be accurate. In addition, the time delay between pulse applications should be constant to prevent distortion of the characteristic signature. For example, if the pulse intervals are not constant, the energy storage remaining in the transformer winding configuration will be different between pulses, thus altering the load impedance of the transformer and therefore, changing the parameters of the applied pulse. Furthermore, test signal/pulse generators or test pulse generators capable of providing such exact and repetitive input signals or pulses are expensive. Also, personnel must take time from their otherwise busy schedule to de-energize the transformer and to perform the tests.

Therefore, it is desirable to have a valid and reliable testing system and method that does not require the transformer to be de-energized. Also, it would be desirable for the test equipment to be inexpensive, to be easily portable, and to be easily implemented in the field where the transformer is located. Furthermore, it would be desirable to have the test signal/pulse generator configured to provide a wide variety of test signals/pulses suitable for testing a wide variety of transformers.

SUMMARY OF THE INVENTION

The present invention provides a system and method for determining a characteristic signature, H(f), of an energized winding. Briefly described, in architecture, the system and method can be implemented as follows.

In one embodiment, a sensor detects incoming voltage pulses due to abrupt changes in current or voltage originating elsewhere on the energy delivery system. The above described incoming pulses enter the transformer winding that is monitored by the sensor. Another sensor detects an output pulse after the applied input pulse has propagated through the monitored winding. Spectral densities are determined from these detected input and output pulses. However, the electrical characteristics of these pulses, such as the current, voltage, frequency, wave shape and/or energy are unpredictable and vary randomly from pulse to pulse. Not all pulses will have sufficient energy to generate useable information that can be used to calculate spectral densities for all the frequencies of interest. Some pulses may have sufficient energy so that the spectral densities for all of the frequencies of interest are calculated. Other pulses will have sufficient energy in some frequencies so that spectral densities for some portions of the frequencies of interest are calculated. The present invention, an on-line winding test unit, monitors a winding and records the input and output pulses. Logic is executed that analyzes the input and output pulses by way of spectral densities to identify useable H(f) data, which is further processed to build a transfer function from the pieces of usable data. When a sufficient record of useable H(f) data portions are accumulated, a complete characteristic signature, H(f), for the monitored winding is constructed. Winding deformation and/or displacement can be determined by comparing the most recent computed characteristic signature with an earlier characteristic signature.

In another embodiment, data corresponding to the detected input pulse, and data corresponding to the detected output pulse, is stored in a memory. Incoming data corresponding to the detected input pulse and the detected output pulse are allocated to a plurality of frequency bins by the digitization process for later analysis. The frequency bins are defined by the digital sampling rate and the data record length and can be refined further with zero padding. This produces a predefined frequency bin width in the frequency domain. Thus, the plurality of frequency bins provides a convenient way to partition the frequency range of the characteristic signal. For example, that frequency domain portion of the detected input pulse and the detected output pulse over the range of 1,000 kilo-Hertz (kHz) to 1,010 kHz would be "assigned" to the bin designated for the frequency range of 1,000 kHz to 1,010 kHz, thus creating a data point for that 10 kHz wide frequency bin. Likewise, the remaining frequency domain data of the detected input pulse and the detected output pulse are assigned to the plurality of frequency bins according to the frequency of the data, thereby creating a plurality of data points for the respective frequency bins. In one embodiment, the frequency bin bandwidth is 3 kHz.

In another embodiment, after the input and output waveforms are digitized using a predetermined sampling rate and record length, the required spectral densities are calculated. First, the auto-spectral density (Gxx) is calculated. Gxx is defined by the complex conjugate of the FFT of the input pulse times the FFT of the input pulse. Second, the cross-spectral density (Gxy) is calculated. Gxy is defined by the complex conjugate of the FFT of the input pulse times the FFT of the output pulse. The logic then calculates the characteristic signature [H(f)] for the winding such that H(f) equals the average of the Gxy's divided by the average of the Gxx's for the respective pairs of input and output pulses. This H(f) representation is chosen for noise rejection in the output signal. For example, only the output components which are correlated with the input pulse are accepted. Anything extra, such as un-correlated noise, is rejected by definition. As opposed to the prior art, spectral densities work best when the input pulses are slightly different or very different in shape.

To determine the acceptability of H(f) for each frequency bin, a coherence function $\gamma^2_{xy}(f)$ is calculated for each bin, according to the equation below:

$$\gamma^2_{xy}(f)=|G_{xy}(f)|^2/G_{xx}(f)G_{yy}(f)$$

The coherence function $\gamma^2_{xy}(f)$ is a real valued function having a magnitude ranging from 0 to 1. A value of 1 would indicate a perfect linear relationship from the input pulse to the detected output pulse. In addition, a value of 1 indicates that there was sufficient input energy in the applied pulse such that the H(f) for the frequencies of interest could be accurately calculated. A value between 0.4 and 1.0 indicates that the H(f) data points in the bin have some reasonable degree of accuracy. In one embodiment, the H(f) data points are weighted more heavily as the coherence value increases from 0.4 to 1.0 after the calculation of characteristic signature of the monitored winding. Data points having a coherence value of less than 0.4 are considered as invalid data (not having sufficient energy at the frequency of that bin) and are rejected. A value of 0 would indicate a complete non-linear relationship between the input and detected output pulses or not enough input energy for that frequency bin calculation.

Additionally, a random error function $E_r|H(f)|$ for each bin is calculated, according to the equation below:

$$E_r|H(f)|=[1-\gamma^2_{xy}(f)]^{1/2}/|\gamma_{xy}(f)|(2n_d)^{1/2}$$

In one embodiment, the random error function is calculated from a previously accumulated data base known to be valid. The random error, $E_r|H(f)|$, provides a statistical analysis of the data and defines a 95% confidence interval for the H(f) data that is graphed over a frequency range of interest. The random error for the frequency bin(s) of the present data evaluation period can be compared to the random error for the same frequency bin(s) on a past data evaluation period for the same winding. If the random error increases significantly for the 95% confidence interval during a follow-up period, then there is a problem with the equipment set-up for this particular test. For example, there could be problems such as loss of input pulse, open leads, or open connections, or wrong connections etc. with the test set. A real change in H(f) due to winding displacement will not significantly change the random error calculation for a given test configuration.

After a suitable number of input pulses have propagated through the monitored winding such that a pre-determined number of frequency bins contain a suitable amount of valid data for analysis, in one embodiment, the processor automatically calculates and stores the characteristic signature of the monitored winding. The H(f) data points for a selected number of frequency bins are combined to create a characteristic signature over the frequency range of interest. Many of the "empty" or unusable frequency bins can be omitted from the H(f) construction and still provide a very good H(f) representation. For example, most winding deformation and/or dislocation will alter the H(f) over many adjacent frequency bins, so omitting frequency bins will not significantly compromise the H(f) construction. In one embodiment, the frequency range of interest is from approximately 3.0 kilo-Hertz (kHz) to approximately 5.0 mega-Hertz (MHz).

One embodiment of the on-line winding test unit includes logic that automatically analyzes the coherence function and the random error function of two separate H(f)'s. This information is used in comparing a previously calculated H(f) to the present H(f) to determine a comparison number. The overall comparison number, which is based on the sum of the individual frequency bin comparisons, is weighted on the value of the two respective error functions for the two H(f)'s being compared. For example, if the individual H(f) point errors are large (but still about the same magnitude), the calculated difference between the two H(f)'s for this frequency bin is automatically reduced. Based upon pre-defined empirical test data, the calculated comparison number is displayed with a color coded system. For example, if the comparison displays a number in green, then little or no change has occurred between the two compared H(f)'s of the monitored transformer winding. If the comparison numbers are displayed in yellow, then the yellow color indicates that some change has occurred. However, such changes denoted by the yellow color may be considered to be associated with temperature differences between the data bases, differing conditions of transformer oil between the data bases, normal aging of the insulation that occurs over a number of years, and/or some other change in the transformer not necessarily related to winding deformation or displacement. If the comparison numbers are displayed in red, an indication of a significant change in the monitored winding is indicated, such as a possible winding deformation or displacement. Should the comparison calculations be well into the red zone, the monitored winding should be inspected and scheduled for possible repair in the near future. Therefore, this embodiment of the on-line winding test unit is particularly well-suited for use by an individual who is not necessarily skilled in the art of analyzing transformers, such as a technician or other maintenance personnel.

Another embodiment includes a pulse or signal generator. The pulse or signal generator generates a pulse having characteristics that provide useable data in the frequencies of interest. This embodiment is particularly suited for supplementing the data collected from incoming pulses originating on the energy delivery system.

Other systems, methods, features, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The on-line winding test system and method, as defined in the claims, can be better understood with reference to the following drawings. The components within the drawings are not necessarily to scale relative to each other, emphasis instead being placed on clearly illustrating the principles of the on-line winding test system and method.

Figure 1:
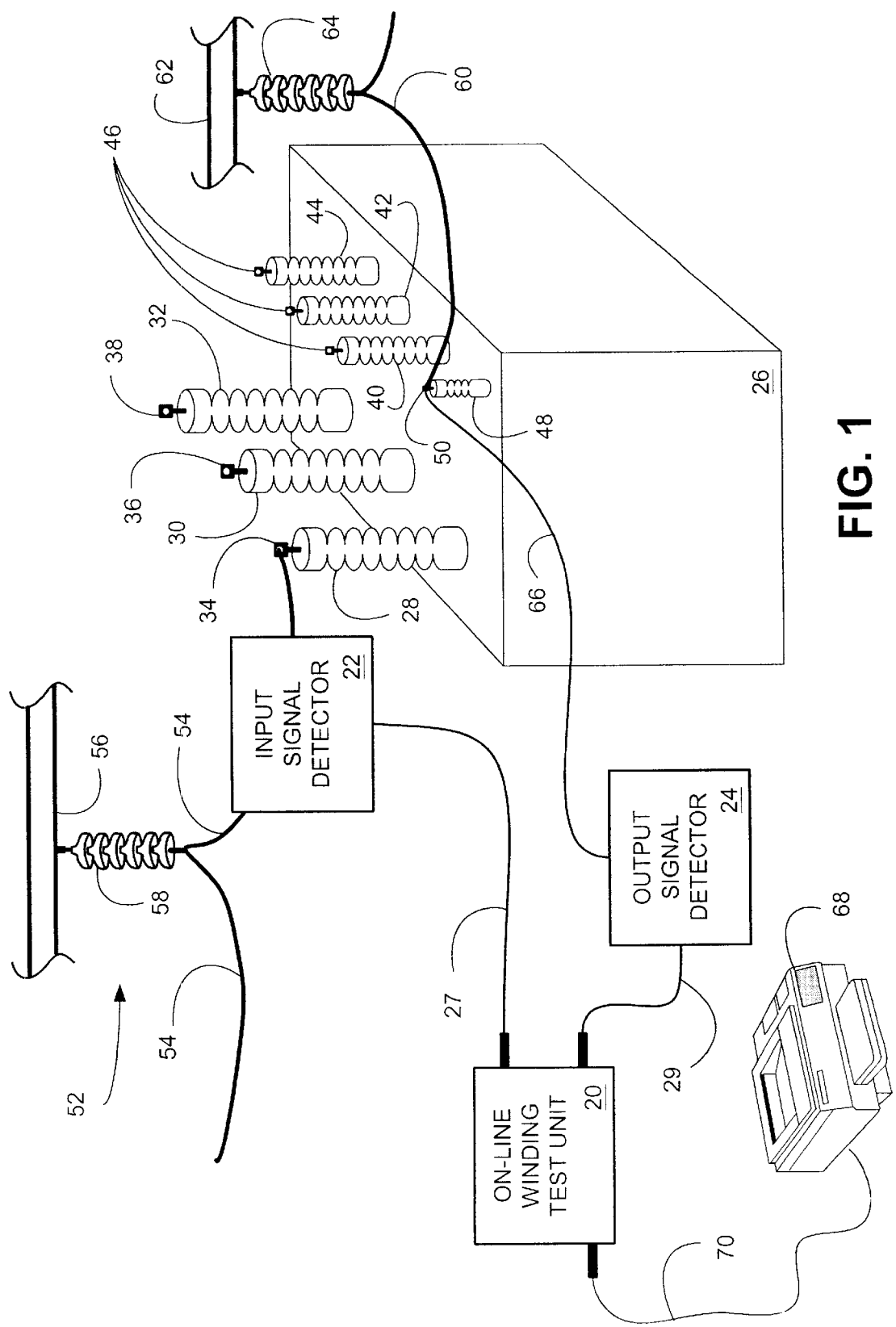
FIG. 1 is a simplified illustrative block diagram of the on-line winding test unit of the present invention coupled to a transformer.

For convenience of illustration, elements among the several figures that are similar to each other may bear the same reference numerals. Such elements bearing the same reference numerals may be considered to be like elements. However, one skilled in the art will realize that like numeraled elements among the several figures need not be identical, as any variations of such elements will not adversely affect the functioning and performance of the present invention. Furthermore, like elements that are like-numbered may be described in detail only in the first instance of occurrence, and not described in detail again when occurring in subsequent figures.

DETAILED DESCRIPTION OF THE INVENTION

A. Overview Of The On-Line Transformer Testing System And Method

FIG. 1 is a simplified illustrative block diagram of the on-line winding test unit 20, input signal detector 22 and output signal detector 24 of the present invention coupled to a transformer 26. On-line winding test unit 20 is coupled to the input signal detector 22 via connection 27 and is coupled to the output signal detector 24 via connection 29.

Transformer 26 is a well known voltage conversion device employed in energy delivery systems. Detailed operation of the transformer 26, and many of the individual components associated with transformer 26 are not described in detail herein, other than to the extent necessary to understand the operation and functioning of transformer 26 when tested by the on-line winding test unit 20. Thus, one skilled in the art will appreciate that the simplified diagram of transformer 26 illustrates only a few of the many transformer components residing on the outside of transformer 26 and none of the internal components residing inside transformer 26.

Transformer 26 is illustrated as having three high voltage bushings 28, 30 and 32. Each high voltage bushing 28, 30 and 32 has a corresponding terminal 34, 36 and 38 for coupling the high voltage side of transformer 26 to a high voltage portion the energy delivery system. Transformer 26 also includes three low voltage bushings 40, 42 and 44. Low voltage bushings 40, 42 and 44 each have a terminal 46 used to couple transformer 26 to a low voltage portion of the energy delivery system. A neutral bushing 48, having a terminal 50, also resides on transformer 26.

As well known in the art, high voltage bushings 28, 30 and 32 have wire leads (not shown) which couple the terminals 34, 36 and 38 to the high voltage side of the windings (not shown) residing in transformer 26. Likewise, low voltage bushings 40, 42 and 44 have wire leads (not shown) coupling terminals 46 with the low voltage side of the windings (not shown) residing in transformer 26. Neutral bushing 48 also includes a wire connector coupling terminal 50 to an internal common point (not shown) associated with the windings (not shown) residing in transformer 26. This common point is normally grounded externally. The above-described configuration and construction of the internal components of transformer 26 are well known in the art and are not described in further detail other than to the extent necessary to understand the operation and functioning of these components when tested by the on-line winding test unit 20.

The transformer 26 illustrated in FIG. 1 is commonly known as a three phase transformer. Thus, three high voltage bushings 28, 30 and 32 are coupled to the low voltage bushings 40, 42 and 44 via the windings (not shown) residing inside transformer 26. The nomenclature typically employed within the industry to identify the three phases are: phase A, phase B and phase C. Thus, a transformer 26 configured for a three phase operation would have one high voltage bushing and one low voltage bushing associated with phase A, a second high voltage bushing and a second low voltage bushing associated with phase B, and a third high voltage bushing and a third low voltage bushing associated with phase C. For example, high voltage bushing 28 and low voltage bushing 40 may be associated with phase A in transformer 26. Similarly, high voltage bushing 30 and low voltage bushing 42 may be associated with phase B and high voltage bushing 32 and low voltage bushing 44 may be associated with phase C.

For convenience of illustration, a portion of the high voltage energy delivery system 52 that the high voltage bushing 28 is coupled to is illustrated in FIG. 1. A conductor 54 couples terminal 34 of the high voltage bushing 28 to the high voltage portion of the energy delivery system 52. Typically, conductor 54 is suspended from a structural member 56 with insulator 58. Insulator 58 provides electrical isolation from the conductor 54 and the structural member 56. Terminals 36 and 38 are similarly connected with conductors to provide connectivity back into the high voltage energy delivery system. However, such conductors are not shown for convenience of illustration. Likewise, conductors (not shown) coupled to terminals 46 couple the low voltage side of transformer 26 into the low voltage energy delivery system (not shown).

A conductor 60 is coupled to terminal 50 of the neutral bushing 48 to provide connectivity back to a suitable grounding point (not shown). Conductor 60 is illustrated as being supported by structural member 62 with an insulator 64.

Input signal detector 22 is coupled to a convenient location on conductor 4. Alternatively, the input signal detector 22 may be coupled to terminal 34 or another suitable location on the high voltage bushing 28. Input signal detector 22 may be any suitable detecting device such that a pulse applied to terminal 34 is detected by the on-line winding test unit 20. Output signal detector 24 is similarly coupled to terminal 50 of the low voltage bushing 48, via connection 66. Alternatively, output signal detector 24 may be coupled directly to terminal 50 or onto conductor 60 such that the output pulse is detected by the on-line winding test unit 20. Input signal detector 22 and/or output signal detector 24, in one embodiment, are sensors that are already installed and in place on transformer 26, such as, but not limited to, a bushing capacitive tap, a current transformer (CT) or the like. Alternatively, input signal detector 22 and/or output signal detector 24 in another embodiment are commercially available high voltage dividers or clamp-on CTs. In yet another embodiment, input signal detector 22 and/or output signal detector 24 are specially designed and fabricated sensors. Any such well known sensor described above, or other types of suitable sensors, are acceptable devices for the detecting of the input pulses and the output pulses so long as the sensors are sufficiently sensitive to high frequency signals such that the pulses detected by the signals result in sufficiently accurate data over the frequencies of interest necessary for the determination of the characteristic signature of the monitored transformer energized winding.

When a pulse is generated out on the energy delivery system and applied to terminal 34, the pulse propagates through terminal 34, through the high voltage bushing 28, through the energized windings (not shown), and out to terminal 50 of the neutral bushing 48. Input signal detector 22 detects the generated pulse applied to terminal 34. Output signal detector 24 detects the output pulse on terminal 50. Signals corresponding to the detected input pulse and output pulse are provided to the on-line winding test unit 20 for storage in a memory and for later processing, as described below.

For convenience, on-line winding test unit 20 is illustrated as being coupled to printer 68 via connection 70. Thus, upon conclusion of the analysis of the input and output pulses, on-line winding test unit 20 outputs one or more suitably formatted reports to printer 68 for printing. One skilled in the art will appreciate that the on-line winding test unit 20 is configured to output any of a variety of suitable output signal formats. For example, another embodiment of on-line winding test unit 20 is configured to provide output to a display screen such as a cathode ray tube (CRT) or other suitable display screen. Another embodiment of on-line winding test unit 20 is configured to provide an output signal that is stored on a suitable storage media. Examples of suitable storage media include, but are not limited to, any one or combination of volatile memory elements (e.g., random access memory (RAM, such as DRAM, SRAM, etc.)) and nonvolatile memory elements (e.g., ROM, hard drive, tape, CDROM, etc.). Moreover, suitable storage media may incorporate electronic, magnetic, optical, and/or other types of storage media. Note that the suitable storage media can have a distributed architecture, where various components are situated remote from one another, but can be accessed by the on-line winding test unit 20, either directly or indirectly. Such an embodiment of the on-line winding test unit 20 would be particularly suitable for providing documentation of analysis results, for storing data and/or analysis results in a centralized location for future use, and/or for analyzing data in additional detail.

Figure 2:
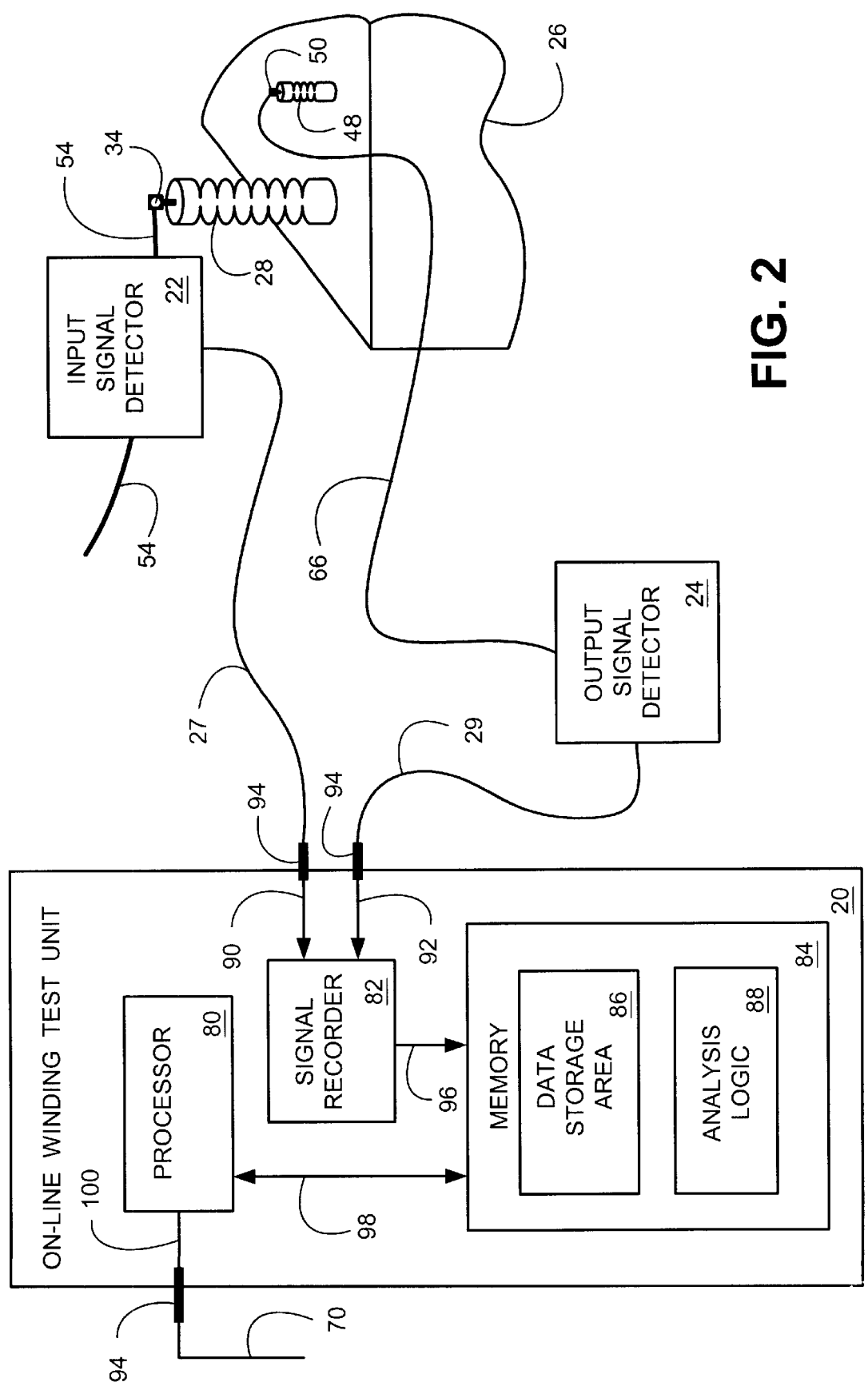
FIG. 2 is a block diagram illustrating selected components residing in the on-line winding test unit and the sensing element of FIG. 1.

B. Selected Components Residing In A Preferred Embodiment Of A Transformer Testing System And Method FIG. 2 is a block diagram illustrating selected components residing in the on-line winding test unit 20. On-line winding test unit 20 includes at least a processor 80, a signal recorder 82 and a memory 84. Memory 84 includes a data storage area 86 and the analysis logic 88.

Incoming pulses applied to terminal 34 are detected by the input signal detector 22. A signal corresponding to the detected input pulse is provided to the signal recorder 82, via connection 90 which is coupled to connection 27. Similarly, the output pulse is detected by the output signal detector 24 and a signal corresponding to the detected output pulse is provided to signal recorder 82, via connection 92 which is coupled to connection 29. In one embodiment, connection 27 is coupled to connection 90, and connection 29 is coupled to connection 92, with a commonly available plug-in connector 94. Examples of plug-in connector 94 include, but are not limited to, a commercially available banana plug, coaxial cable connector, alligator clip, lug, screw or the like. Alternatively, connections 27 and 29 are fixably attached to connections 90 and 92, respectively, thereby providing a secure coupling.

Signal recorder 82 is coupled to memory 84 via connection 96. The received signals corresponding to the input and output pulses detected by the input signal detector 22 and the output signal detector 24, respectively, are processed into an appropriate data format for storage into the data storage area 86 in a manner described below.

Processor 80 is coupled to memory 84 via connection 98. Processor 80, as described hereinafter, executes the analysis logic 88 residing in memory 84 so that the data corresponding to the detected input and output pulses, described above and residing in the data storage area 86, are processed into frequency bins in a manner described below. Processor output connection 100 is coupled to connection 70 so that a suitable output report may be provided. For convenience of illustration, connection 100 is coupled to connection 70 with a plug-in connector 94, described above. However, alternative embodiments may employ other types of suitable connectors, or connection 100 may be fixably attached to connection 70, without departing substantially from the operation and functionality of the present invention.

In an alternative embodiment, processor 80 is coupled to an optional viewing screen (not shown). The optional viewing screen is used by a user to view selected detected input and output pulses, and/or the output reports generated by processor 80. The viewing screen may be any suitable device for displaying an output signal. For example, but not limited to, a viewing screen may be a cathode ray tube (CRT), a flat panel screen, a light emitting diode (LED) screen, liquid crystal display (LCD), or any other well known viewing device. An on-line winding test unit 20 employing any suitable viewing screen embodiment is intended to be within the scope of this disclosure and protected by the accompanying claims.

Summarizing, when on-line winding test unit 20 and output signal detector 24 are coupled to transformer 26 as described above, a pulse originating on the energy delivery system, detected by the input signal detector 22, propagates through the transformer energized windings (not shown) and an output pulse is detected by output signal detector 24. A signal corresponding to the detected input pulse and a signal corresponding to the detected output pulse are provided to signal recorder 82. Signal recorder 82 receives the signals and provides data corresponding to the signals to memory 84 for storage in the data storage area 86 on memory 84.

C. Storing Detected Input and Out Pulses

As the signal recorder 82 is providing data corresponding to the detected input pulse and the detected output pulse into the data storage area 86, processor 80 executes analysis logic 88 to further process the stored input pulse and output pulse data. Ultimately, a characteristic signature of the monitored transformer energized winding is calculated over a frequency range of interest. In one embodiment, the frequency range of interest is from approximately 3.0 kilo-Hertz (kHz) to approximately 5.0 mega-Hertz The characteristic signature frequency range of interest is divided up into a plurality of frequency "bins" each having a predefined frequency width, or bandwidth, such that the plurality of frequency bins span the entire frequency range of interest in a continuous non-overlapping manner. Thus, the plurality of frequency bins provide a convenient way to partition the frequency range of the characteristic signal. The data corresponding to the detected input pulse is divided up into frequency portions corresponding to the frequencies of the frequency bins according to the digitization and FFT process, and the data associated with each of the frequency bins is assigned to that frequency bin. Likewise, data associated with the detected output signal is divided up and allocated to the appropriate frequency bins. Thus, for each detected input pulse and detected output pulse, data is allocated into each one of the frequency bins during the digitization and FFT process.

For example, an exemplary frequency bin may have an assigned frequency range of 1,000 kHz to 1,010 kHz in the frequency domain. The data from the FFT of the detected input pulse corresponding to a frequency range of 1,000 kHz to 1,010 kHz is assigned to the above-described 10 kHz wide frequency bin. Likewise, the detected output pulse FFT data corresponding to a frequency range of 1,000 kHz to 1,010 kHz is assigned to the above-described frequency bin. Thus, frequency data is created having a first portion corresponding to the detected input pulse (10 kHz in width starting at 1,000 kHz) and a second portion corresponding to the detected output pulse (10 kHz in width starting at 1,000 kHz).

One skilled in the art will appreciate that the frequency range of the detected input and output pulses may be divided up into any manner of frequency bins. Such bins may all be uniform in bandwidth (range of frequency allocation), or the frequency bins may have differing frequency bandwidth, without departing substantially from the operation and functionality of the present invention as described below. One embodiment employs a plurality of 3 kHz wide frequency bins. The specification of the frequency bins is determined by the specific architecture in which the on-line winding test unit system is implemented and the desired degree of analytical accuracy.

An alternative embodiment of the on-line winding test unit 20 is configured such that the signal recorder 82 provides data corresponding to the detected input pulse and the detected output pulse directly to processor 80. Processor 80 processes the data received from the signal recorder 82 into the appropriate frequency bins, and then stores the data points for each of the frequency bins into the data storage area 86. Such an embodiment may be particularly advantageous when the overall memory storage region of memory 84 is limited in capacity.

D. Spectral Analysis of the Detected Input and Detected Output Pulses

As described above, a voltage pulse (corresponding to an abrupt change in voltage and/or current) is generated out on the energy delivery system. The pulse propagates through the energy delivery system to the transformer 26 and is subsequently applied to the monitored terminal 34 of transformer 26. The incoming pulse is detected by the input signal detector 22 and an output pulse is detected by the output signal detector 24. Data corresponding to the detected input and output pulses are then simultaneously digitized and processed by FFT to be allocated to a plurality of predefined frequency bins. Thus, for each of the detected input pulses and output pulses, a frequency domain data point is stored in each one of the frequency bins. Next, the analysis process computes the auto-spectral densities and a cross-spectral density of each of the data points for each frequency bin, as described below.

For each frequency bin, the auto-spectra Gxx(f) is calculated by computing the complex conjugate (*) of the Fast Fourier Transform (FFT) of the input pulse, x(t), and then multiplying by the FFT of the same input pulse as shown in equation 1 below:

$$G_{xx}(f)=[X(f)^*]X(f) \qquad \text{Eq. 1}$$

Where X(f) is the FFT of the input signal x(t)

Then, for each frequency bin, the auto-spectra Gyy(f) is calculated by computing the complex conjugate (*) of the FFT of the output pulse, y(t), and then multiplying by the FFT of the same output pulse, as shown in equation 2 below:

$$G_{yy}(f)=[Y(f)^*]Y(f) \qquad \text{Eq. 2}$$

Where Y(f) is the FFT of the output signal y(t)

Next, the cross-spectra Gxy(f) from input to output is calculated by computing the complex conjugate (*) of the FFT of the input pulse x(t), with the FFT of the output pulse y(t) as shown in equation 3 below:

$$G_{xy}(f)=[X(f)^*]Y(f) \qquad \text{Eq. 3}$$

Where X(f) is the FFT of the input signal x(t)
And Y(f) is the FFT of the output signal y(t)

For each frequency bin, H(f), is calculated in one embodiment by dividing approximately 10 averages of the cross-spectra Gxy(f) by the corresponding approximately 10 averages of the auto-spectra Gxx(f) for each one of the frequency bins in accordance with equation 4 below:

$$H(f)=G_{xy}(f)/G_{xx}(f) \qquad \text{Eq. 4}$$

Other embodiments may calculate H(f) using any suitable number of Gxy(f) and Gxx(f) data.

Next, a determination must be made whether or not each one of the calculated characteristic signature portions of H(f) is valid or invalid. That is, for each data point associated with each data bin, the characteristic signature portion is evaluated to determine if the data point provides useable information. If the data point is determined to be valid, the data point is saved for further analysis. If the data point is determine to be invalid, the data point is rejected and/or discarded. Thus, a database having valid H(f) data points is eventually accumulated after the detection of a suitable number of pulses such that a characteristic signature for the monitored transformer energized winding may be determined, in a manner described hereinafter.

To determine whether a data pair in a frequency bin is valid or invalid, the coherence of the data point and/or the random error of the data point is considered. The coherence for each data point is calculated according to the coherence function $\gamma^2_{xy}(f)$, as shown in equation 5 below:

$$\gamma^2_{xy}(f)=|G_{xy}(f)|^2/G_{xx}(f)G_{yy}(f) \qquad \text{Eq. 5}$$

The coherence function $\gamma^2_{xy}(f)$ is a real valued function having a magnitude ranging from 0 to 1. A value of 1 would indicate a perfect linear relationship from the input pulse portion to the detected output pulse portion in the frequency bin. A value of 0 would indicate a complete non-linear relationship between the input pulse portion and the detected output pulse portion in the frequency bin. In addition, the coherence function is sensitive to improper digitizing (alaising) of the input and output pulses and will also respond to high input noise levels. Problems in all these areas will lower the calculated coherence value on a point by point basis of the transfer function H(f). The coherence function $\gamma^2_{xy}(f)$ is very sensitive to relatively small errors in the magnitude (or phase) estimate for the characteristic signature, H(f). In one embodiment, a data point having a coherence of 0.4 or greater is considered as a valid data point. Data points having a coherence of less than 0.4 are considered invalid and are rejected.

Additionally, a further determination of whether data in a frequency bin or any number of bins is valid or invalid is made by computing the random error function for the H(f). The random error, $E_r|H(f)|$, provides a statistical analysis of the data and defines a 95% confidence interval for the H(f) data that is graphed over a frequency range of interest. The random error for the frequency bin(s) of the present test can be compared to the random error for the same frequency bin(s) on a past test for the same test configuration. If the random error increases significantly for the 95% confidence interval during a follow-up test, then there is a problem with the test set-up for this particular test. For example, there could be problems such as loss of input pulse, open leads, or open connections, or wrong connections etc. with the test set. A real change in H(f) due to winding displacement will not significantly change the random error calculation for a given test configuration.

The 95% confidence interval is calculated according to the random error function $E_r|H(f)|$, as shown in equation 6 below, from a previously collected data base of known valid data points:

$$E_r|H(f)|=[1-\gamma^2_{xy}(f)]^{1/2}/|\gamma_{xy}(f)|(2n_d)^{1/2} \qquad \text{Eq. 6}$$

The term $n_d$ equals the number of spectral density averages used in the H(t) calculation One method which can be used to validate the H(f) data points is to compare the results of equation (6) on the data in question to past data which is known to be valid. This is performed on a point by point basis for the H(f) in question. Known valid H(f) data used in the above random error function calculation may be collected in several different manners. For example, the data points known to be valid may have been collected during a previous off-line testing of the transformer according to the testing process described in the copending application Ser. No. 09/848,861 entitled "SYSTEM AND METHOD FOR OFF-LINE IMPULSE FREQUENCY RESPONSE ANALYSIS TEST", which is entirely incoporated herein by reference.

Or, the data points known to be valid may have been collected during an on-line testing process employed by an alternative embodiment of the on-line winding test unit, described below. Such an embodiment includes a means for generating a test signal or pulse that is applied to the energized monitored transformer winding such that a sufficient number of data points known to be valid are collected.

Or, the data points known to be valid may have been collected from a suitable number of data points having a coherence greater than a predefined coherence value. For example, but not limited to, data points having a coherence of 0.4 or more may be viewed as being acceptable with some consideration given to coherences between 0.4 and approximately 0.7. Coherence values from approximately 0.7 to 1.0 may be viewed as being acceptable without further consideration. Such a group of data points could be used to calculate a 95% confidence interval. (One skilled in the art will appreciate that other suitable confidence spectral density equations could be selected without departing substantially from the operation and functionality of the present invention.)

E. Construction of a Characteristic Signature based Upon Valid Data Points

Over a period of time, a sufficient number of pulses are generated out on the energy delivery system. These pulses propagate through the energy delivery system to transformer 26 (FIGS. 1 and 2). Many of the pulses will have sufficient energy in at least some portions of the frequency range of the characteristic signature to generate a plurality of valid data points for H(f). After a sufficient number of input pulses have propagated through the monitored energized winding such that a pre-determined number of frequency bins contain a suitable amount of usable data for analysis, the processor 80 (FIG. 2), in one embodiment, automatically calculates a characteristic signature of the monitored energized winding. The H(f) data points for a selected number of frequency bins are combined to create a characteristic signature over the frequency range of interest. Many of the "empty" or unusable frequency bins can be omitted from the H(f) construction and still provide a very good H(f) representation. For example, most winding deformation and/or displacement alters H(f) over many adjacent frequency bins, so omitting some frequency bins will not significantly compromise the H(f) construction. In summary, the characteristic signature is computed by aggregating the H(f) from the usable and sufficient frequency bins for the H(f) bandwidth of interest.

Figure 3A:
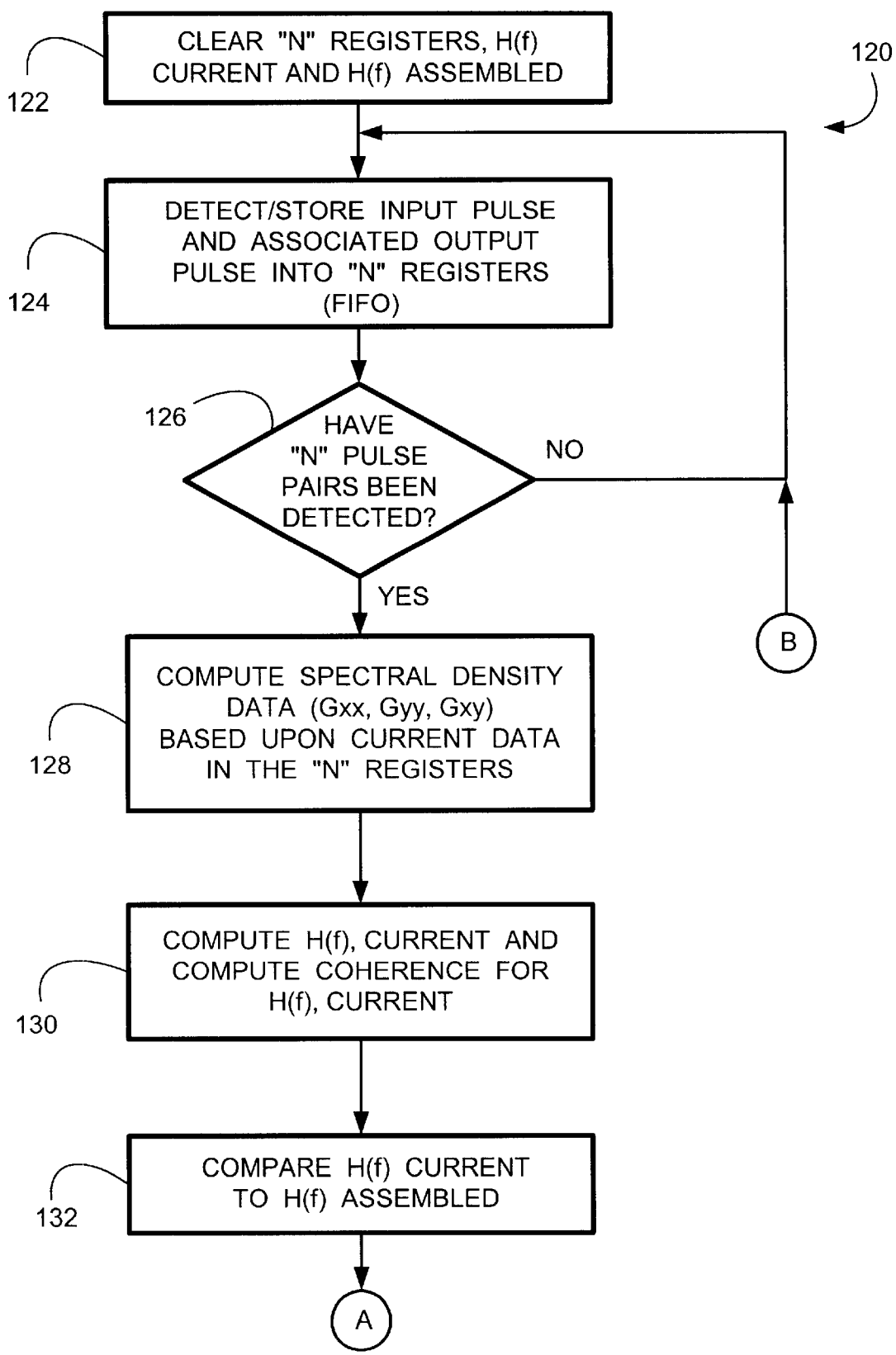
FIG. 3A is a flow chart illustrating an overview of the on-line winding testing process and method by the on-line winding test unit of FIGS. 1 and 2.
Figure 3B:
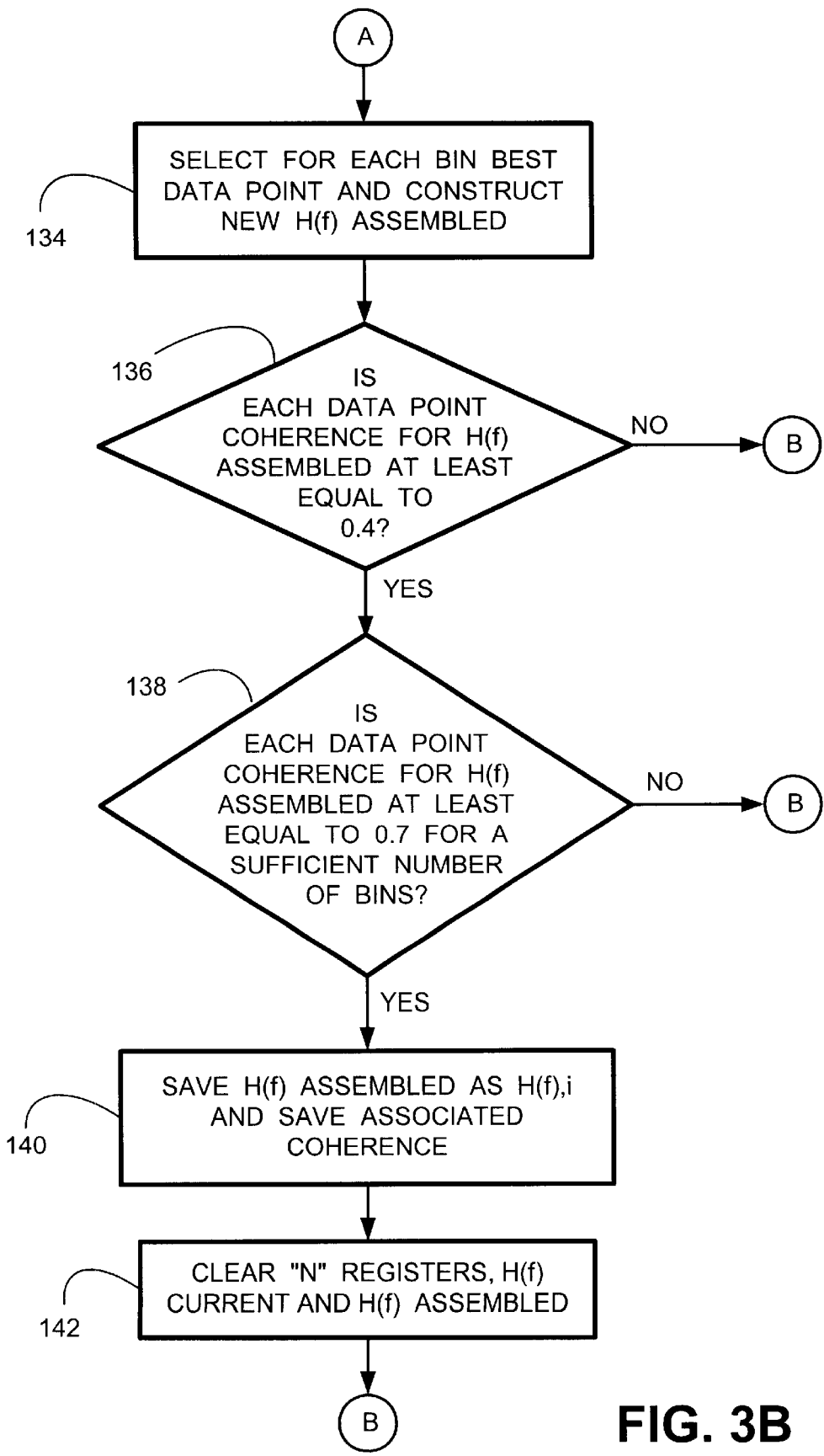
FIG. 3B is a continuation of FIG. 3A.

FIGS. 3A and 3B illustrate a flow chart 120 of the above-described process implemented by the on-line winding test unit 20 (FIGS. 1 and 2) and the associated analysis logic 88 (FIG. 2). In this regard, each block may represent a module, segment, or portion of code, which comprises one or more executable instructions for implementing the specified logical function(s). It should also be noted that in some alternative implementations, the functions noted in the block may occur out of the order noted in FIGS. 3A and 3B or may include additional functions without departing significantly from the functionality of the on-line winding test unit 20. For example, two blocks shown in succession in FIGS. 3A and 3B may in fact be executed substantially concurrently, the blocks may sometimes be executed in the reverse order, or some of the blocks may not be executed in all instances, depending upon the functionality involved, as will be further clarified hereinbelow. All such modifications and variations are intended to be included herein within the scope of this disclosure for the on-line winding test unit 20 and to be protected by the accompanying claims.

The process starts at block 122, where data registers and memories are cleared, deleted or otherwise discarded so that the process begins with no data residing in memory 84 (FIG. 2). At block 124, the input signal detector 22 (FIGS. 1 and 2) and the output signal detector 24 FIGS. 1 and 2) detect an input pulse and an associated output pulse, respectively. Data corresponding to the detected input and output pulses are stored in one of the "N" registers residing in the data storage area 86 (FIG. 2). Thus, a predetermined number of pulse pairs, N, are stored in sequence as they are available. In one embodiment, N equals ten such that ten pulse pairs are detected. In other embodiments, any other suitable number N is specified such that data associated with the pulse pairs are processed in a meaningful manner. At block 126, a determination is made whether N pulse pairs have been detected (an input pulse and an associated output pulse). If not (the NO condition), the process returns to block 124 so that additional pulse pairs are detected.

As described below, the process returns to block 124 so that the next incoming pulse may be detected and processed. When the next pulse arrives, data associated with the detected input pulse and an associated output pulse are stored in the register residing in the data storage area 86 by replacing data associated with the oldest pulse data (if present) currently residing in the register. Thus, new data is accumulated and old data is replaced using a first-in-first-out (FIFO) process.

If N pulses have been detected at block 124 (the YES condition), the process proceeds to block 128. At block 128, processor 80 (FIG. 2) executes the analysis logic 88 (FIG. 2) to compute the spectral densities using the N pulse pairs residing in the registers. The computed spectral densities are also averaged, and a current H(f) is calculated in block 130. Also at block 130, the coherence is computed for the current H(t).

At block 132, the current H(f) is compared to the assembled H(f), described below, on a bin-by-bin basis. At block 134 the best data point, for each bin, is selected from the current H(f) and the assembled H(f). A new assembled H(f) is then constructed. In one embodiment, the best data point is defined as the data point having the largest coherence value. Other embodiments employ other criteria or combinations of criteria. Initially, the assembled H(f) is not available, so the first current H(f) becomes the first assembled H(f) in blocks 132 and 134 to start the process.

At block 136, processor 80 executes the analysis logic 88 to determine if the assembled H(f) coherence values in each bin are at least equal to 0.4. If coherence values in each bin are not at least equal to 0.4 (the NO condition), the process proceeds to block 124 to await additional pulses so that the assembled H(f) is updated such that the coherence values in each bin are at least equal to 0.4. In addition, when a new assembled H(f) enters block 136, all H(f) frequency bins that have higher coherence values compared to the existing H(f) will replace the existing bin values on a bin-by-bin basis.

When the coherence values of the assembled H(f) are all at least equal to 0.4, the process proceeds to block 138. At block 138, a determination is made whether the coherences in the frequency bins for the assembled H(f) are at least equal to 0.7 for a sufficient number of bins. If not (the NO condition), the data used to compute H(f) at block 130 was not sufficient to compute a valid H(f). That is, more data is required. Thus, the process returns to block 124 to await additional pulses. In another embodiment, coherence data may be further processed such that the criteria of block 138 is met. For example, but not limited to, H(f) data and coherence data bins that fail the criteria are discarded and replaced by averaged data from adjacent bins.

If the coherences for a sufficient number of bins are at least equal to 0.7 (the YES condition), the assembled H(f) (at block 134) is known to be valid. This valid H(f) is stored at block 140 as H(f)i. The associated coherence, the value of "N", and a time stamp are also stored at block 140 in conjunction with H(f)i. In this manner, a valid H(f) is pieced together which is made up of the frequency bin points of the highest coherence values of the incoming H(f)'s from block 128.

At block 142, data registers and memories are cleared, deleted or otherwise discarded so that the process begins anew (by returning to block 124) with no data residing in memory 84 (FIG. 2). That is, once a valid H(f) is stored at block 140, a conditional reset may be performed to accept all new incoming H(f) data to restart the piecing together of a new H(f). In other embodiment, the process ends. Yet another embodiment returns directly to block 124 to await for at least the next pulse. Thus, over a period of time, assuming that a sufficient number of incoming voltage pulses due to abrupt changes in current or voltage originating elsewhere on the energy delivery system are available, a number of validated H(f)s will be accumulated.

One skilled in the art will appreciate that the 0.4 threshold applied in block 136 and the 0.7 threshold applied in block 138 are employed in the above described embodiment. In alternative embodiments, other thresholds may be defined, so long as a valid H(f) has been computed.

In another embodiment, respective coherence and random error equations are used to weight differences between the two H(f)'s on a bin-by-bin basis. Weighting produces an overall comparison number to objectively compare the differences between two H(f)'s. The H(f) comparison, along with the associated coherence, error calculations, and/or comparison numbers, are stored in block 142 for display, further analysis, and/or export to other devices. In yet another embodiment, the associated phase versus frequency plots are also maintained throughout the process and are stored for further analysis.

The characteristic signature is calculated for data points collected over some known period of time. The period of time that the data points were collected over must be sufficiently long enough so that a suitable number of data points for each frequency bin are collected. However, the period of time must not be so long as to compromise the characteristic signature due to long term changes such as extreme ambient seasonal temperatures, transformer oil processing, or normal aging etc. That is, the period of time must be short enough that there has been little or no probability of substantial winding deformation and/or displacement. Furthermore, when H(f) and the associated coherence data is saved, other relevant data is also saved such that the H(f) and the associated coherence data is identifiable. For example, but not limited to, the starting and ending dates and/or times of the data collection period may be identified. Transformer serial number, transformer location and/or winding identification may be included. Other information of interest may also be included.

F. Exemplary Hypothetical Characteristic Signature

When the characteristic signature of the monitored energized winding, calculated based upon the valid data points collected during the monitored time period, is compared to a previously calculated characteristic signature for the same monitored energized winding, any significant differences between the two characteristic signatures can be evaluated to determine the probability of deformation and/or displacement of the monitored winding. The process of plotting the characteristic signature, coherence function and confidence bands, and the process of comparing two characteristic signatures, is described in detail below.

Figure 4:
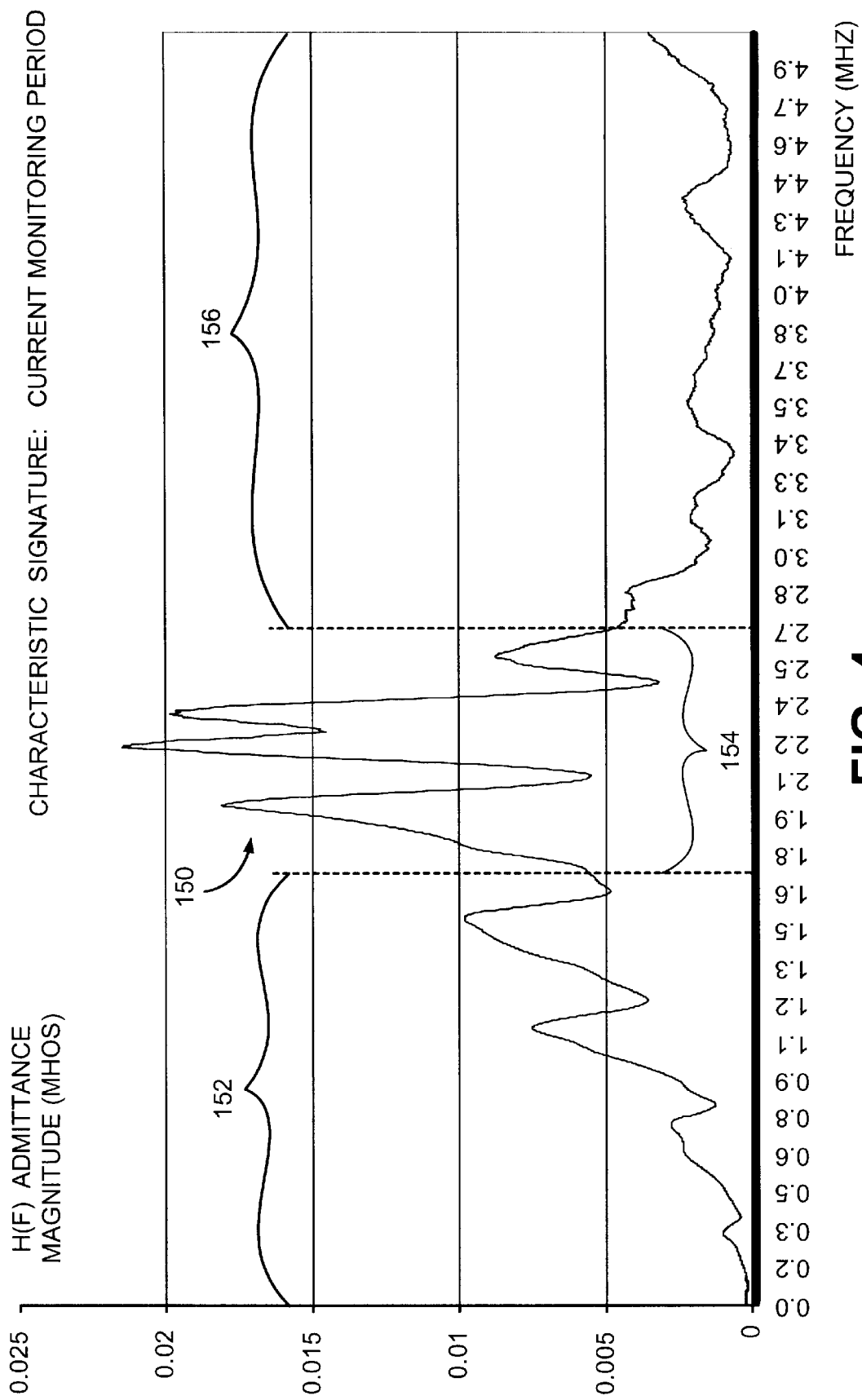
FIG. 4 is a graph of an exemplary, hypothetical transfer function H(f) for a transformer winding.

FIG. 4 is a graph of an exemplary, hypothetical transfer function H(f) 150, hereinafter referred to as the characteristic signature 150, for a monitored energized winding over a frequency range of approximately 3.0 kilohertz (kHz) to approximately 5.0 megahertz (MHz) for transformer 26 (FIGS. 1 and 2). For convenience of discussing a comparison of the characteristic signature 150 with a previously calculated characteristic signature, the transformer winding characteristic signature 150 is subdivided into three sections 152, 154 and 156. Section 152 corresponds to the characteristic signature over the frequency range of approximately 3.0 kHz to approximately 1.7 MHz. The second section 154 corresponds to the characteristic signature from approximately 1.7 MHz to approximately 2.7 MHz. The third section 156 corresponds to the characteristic signature from approximately 2.7 MHz to approximately 5.0 MHz.

For convenience of plotting the transformer winding characteristic signature 150, a frequency range of approximately 3.0 kHz to approximately 5.0 MHz was selected. One skilled in the art will appreciate that any suitable frequency range for the transformer winding characteristic signature could have been selected for plotting. Also, for convenience of plotting the transformer winding characteristic signature 150, the selected vertical axis is the admittance magnitude of the transfer function H(f) as calculated in accordance with equation 4 above. One skilled in the art will appreciate that the vertical axis units could be plotted in a suitable alternative value. One embodiment of the on-line winding test unit 20 (FIGS. 1 and 2) will have fixed the plot axis to a pre-defined range and value. Alternative embodiments of the on-line winding test unit 20 are configured to allow a user to selectively alter the plotted frequency range and/or to selectively alter the vertical axis plotting value and/or plot scale. Any such alternative embodiments providing for a variety of alternative graph formats for the transformer winding characteristic signature, and for the other graphs described below, may be implemented without departing substantially from the operation and functionality of the present invention, and are intended to be within the scope of this disclosure and to be protected by the accompanying claims.

Figure 5:
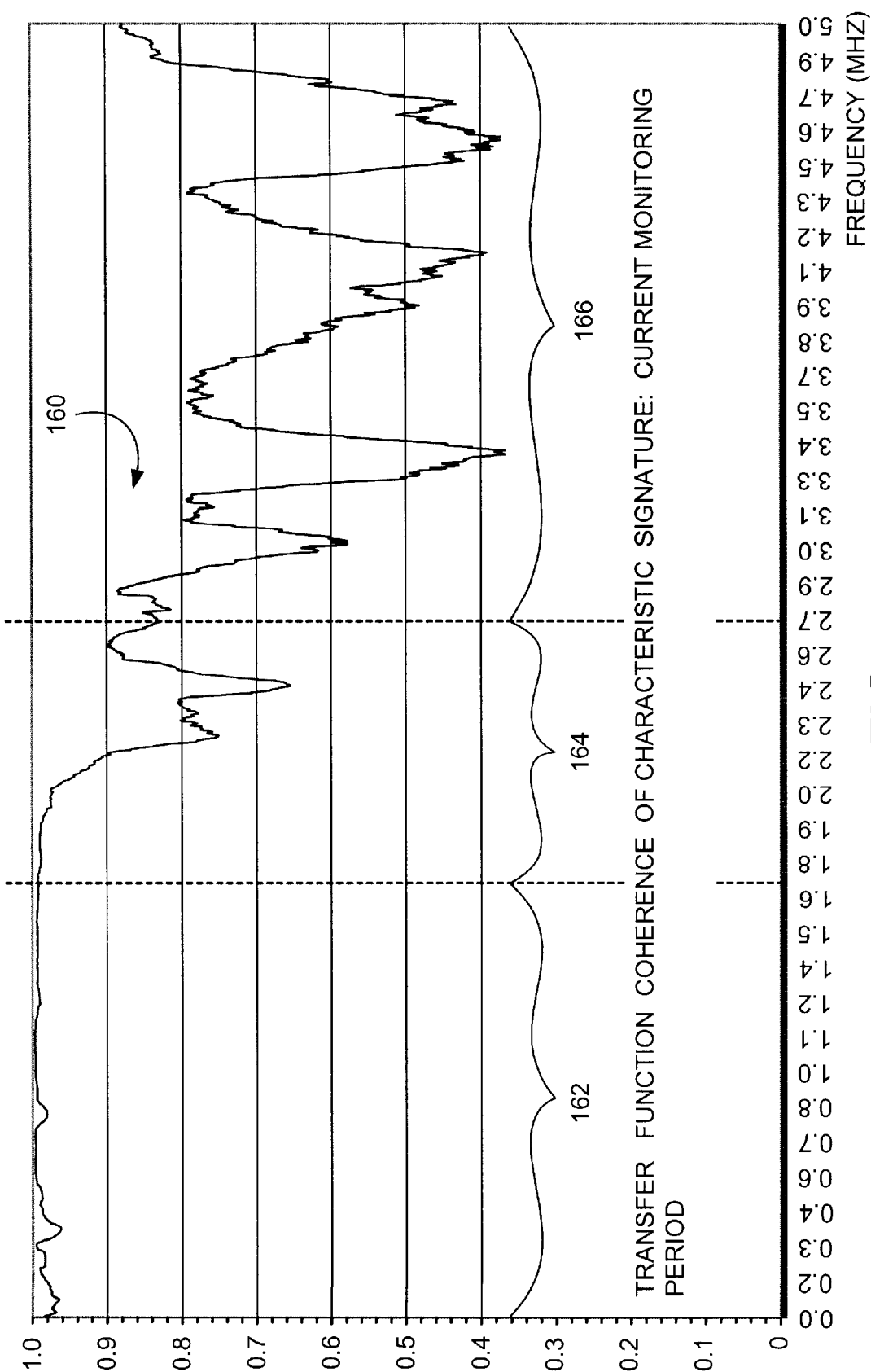
FIG 5 is a graph of the transfer function coherence associated with the transformer winding characteristic signature of FIG. 4.

FIG. 5 is a graph of the transfer function coherence 160 associated with the transformer winding characteristic signature 150 (FIG. 4). The transfer function coherence 160 is an aggregation of the coherence values calculated for the data points in each of the frequency bins. For convenience of discussing the transfer function coherence, the transformer function coherence graph 160 is subdivided into three sections, 162, 164 and 166. Section 162 corresponds to the transfer function coherence over the frequency range of approximately 3.0 kHz to approximately 1.7 MHz. The second section 164 corresponds to the transfer function coherence from approximately 1.7 MHz to approximately 2.7 MHz. The third section 166 corresponds to the transfer function coherence from approximately 2.7 MHz to approximately 5.0 MHz.

The individual analyzing the data may conveniently analyze and interpret the calculated coherence for the data points over a frequency range of interest. Thus, data for a particular monitored energized winding should not be considered invalid when the coherence function $\gamma^2_{xy}(f)$ is not equal to 1, but should be weighted accordingly using good engineering judgment by the individual analyzing the results. That is, the coherence function $\gamma^2_{xy}(f)$ indicates the reliability of the data over the computed frequency range. Section 162 illustrates that the transfer function coherence is nearly equal to 1.0. Thus, the individual analyzing the data could reasonably conclude that the transformer winding characteristic signature 150 (FIG. 4) over the frequency range of approximately 3.0 kHz to approximately 1.7 MHz is valid and reliable.

Section 164 illustrates that the transfer function coherence ranges from approximately 1.0 to approximately 0.6. A significant portion of the transfer function coherence in section 164 lies between a range of 1.0 and 0.8. Thus, an individual analyzing the results may reasonably conclude that the transformer winding characteristic signature 150 (FIG. 4) is reasonably valid and reliable over the frequency range of approximately 1.7 MHz to approximately 2.7 MHz.

The transfer function coherence for section 166 ranges from approximately 0.9 to approximately 0.4. A significant portion of the transformer function coherence ranges between 0.8 and 0.4. The individual analyzing the results may reasonably conclude that there is some level of inaccuracy or distortion in the transformer winding characteristic signature 150 in the frequency range of approximately 2.7 MHz to approximately 5.0 MHz. However, because the transfer function coherence over section 166 lies between 0.8 and 0.4, the transformer winding characteristic signature 150 in the frequency range of approximately 2.7 MHz to approximately 5.0 MHz should not be entirely discounted and/or disregarded. Rather, the transfer function coherence over section 166 indicates that the corresponding portion of the transformer winding characteristic signature after repair does contain some useful information.

The transfer function coherence graph 160 has very few portions having a value between 0.0 and 0.4. Those few portions span very small frequency ranges. Thus, the individual analyzing the results may reasonably conclude that the transfer function coherence graph 160 is indicating that the characteristic signature 150 (FIG. 4) is based upon reasonably valid and reliable data points.

However, if the transfer function coherence graph 160 had a sufficient number of frequency portions below a coherence value of 0.4, the individual analyzing the results may determine that those portions of the characteristic signature 150 (FIG. 4) should be discounted during the process of comparing the characteristic signature 150 with a previous calculated characteristic signature. Alternatively, the individual analyzing the results may elect to execute analysis logic 88 (FIG. 2) to eliminate selected suspect data points such that all portions of the coherence graph 160 are above 0.4. Or, the individual analyzing the results may decide that additional data points for the frequency bins having a coherence value of less than 0.4 are required. Thus, the monitoring time period would be extended to collect additional data points. Alternatively, the individual analyzing the results may initiate a series of test pulses or signals, using an alternative embodiment of the on-line winding test unit 220 (FIG. 9) described below, to create the additional data points.

Figure 6:
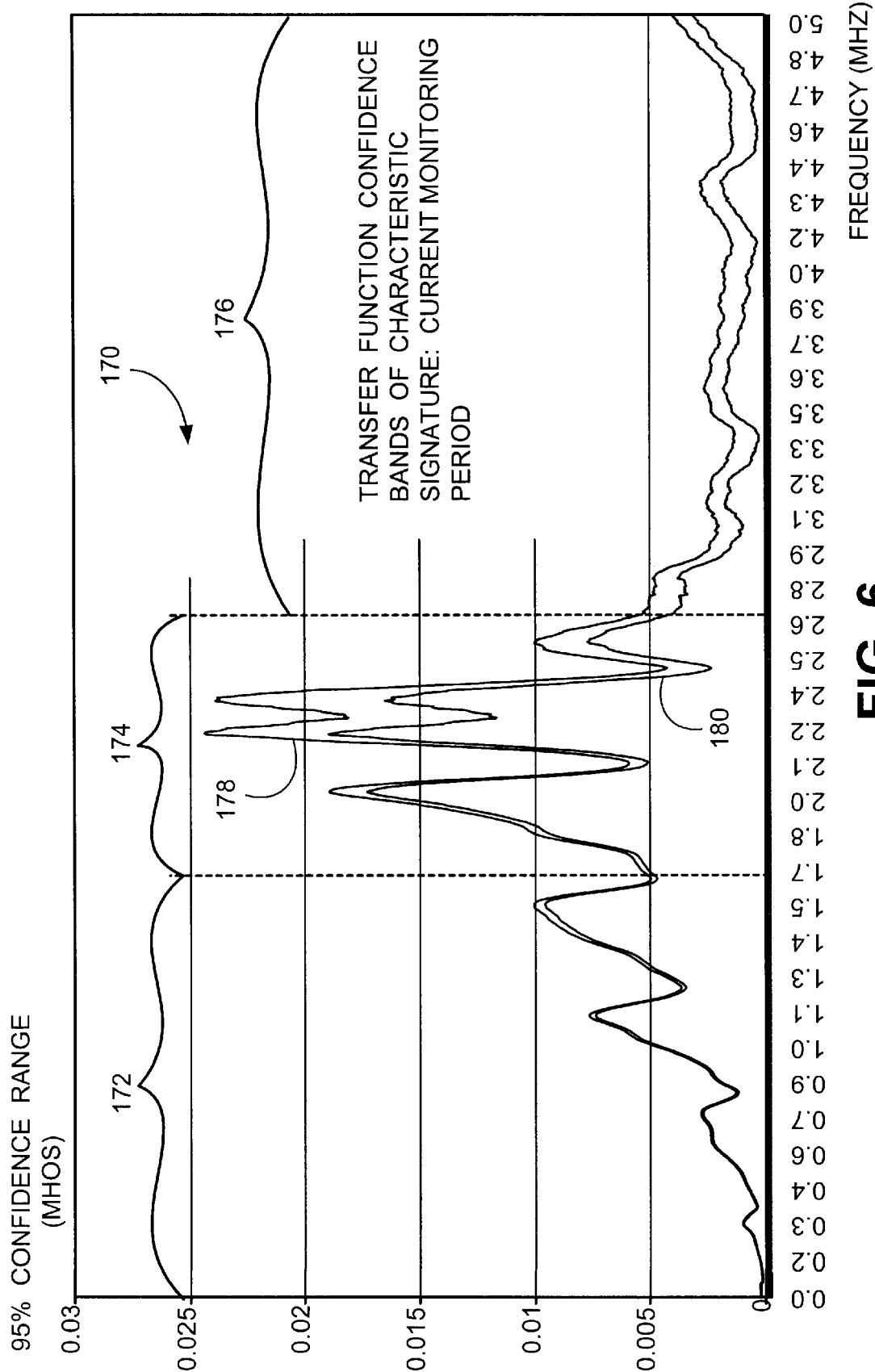
FIG. 6 is a graph of the transfer function confidence bands associated with the transformer winding characteristic signature of FIG. 4.

FIG. 6 is a graph of the transfer function confidence bands 170 associate, with the transformer winding characteristic signature 150 (FIG. 4). The transfer function confidence bands are based upon the random error, $E_r|H(f)|$, calculated for the data points in each frequency bin, according to the random error function $E_r|H(f)|$, shown in equation 6 above. Thus, the individual analyzing the data may conveniently analyze and interpret the calculated random errors by plotting the random error over a frequency range of interest.

The transfer function confidence bands 170 are graphed over a frequency range of approximately 3.0 kHz to approximately 5.0 MHz. For convenience of discussing a comparison of the transfer function confidence bands 170, the graph is subdivided into three secions 172, 174 and 176. Section 172 corresponds to the transfer function confidence bands graph over the frequency range of approximately 3.0 kHz to approximately 1.7 MHz. The second section 174 corresponds to a frequency range from approximately 1.7 MHz to approximately 2.7 MHz. The third section 176 corresponds to a frequency range from approximately 2.7 MHz to approximately 5.0 MHz.

The transfer function confidence bands 170 are made of an upper band line 178 and a lower band line 180. The relative magnitude of separation between the upper band line 178 and the lower band line 180 at any particular frequency indicates the 95% probability range of the corresponding data point on the graph of the transformer winding characteristic signature 150 (FIG. 4). When the upper band line 178 and the lower band line 180 are relatively close together, an individual analyzing the results will appreciate that the associated data point on the graph of the transformer winding characteristic signature 150 is reasonably valid and reliable. Alternatively, when the upper band line 178 and the lower band line 180 at particular frequency are separated by a relatively large distance, the individual analyzing the results will reasonably conclude that there may be some degree of error in the plotting of the associated data point on the graph of the transformer winding characteristic signature 150.

Section 172 indicates that the data points plotted on the graph of the transformer winding characteristic signature 150 between a frequency of approximately 3.0 kHz and approximately 1.7 MHz are valid and reliable data points because the upper band line 178 and the lower band line 180 are nearly coincident to each other. That is, the transformer winding characteristic signature 150 provides valid and reliable information over the frequency range from approximately 3.0 kHz to approximately 1.7 MHz.

Section 174 indicates that the data points on the graph of the transformer winding characteristic signature 150 may have data points exhibiting some degree of questionable validity and reliability. For example, at a frequency of approximately 2.2 MHz, the upper band line 178 is approximately 0.018. The lower band line 180 is approximately 0.012 at the same frequency. This relatively wide separation, having a magnitude of 0.006 (0.018–0.012), indicates that the data points on the graph of the transformer winding characteristic signature 150 for the frequency of 2.2 MHz could range anywhere from a value of 0.012 to 0.018 with a 95% probability. Furthermore, the relatively wide range of separation between the upper band line 178 and the lower band line 180 occurs over the frequency range of approximately 2.15 MHz to approximately 2.5 MHz. The individual analyzing the results may reasonably conclude that the wide separation between the upper band line 178 and the lower band line 180 is indicative of a range of questionable data that should be viewed with some degree of caution. In some instances, the individual analyzing the results may decide that additional test data, and data screening, is required.

Section 176 illustrates that the separation (bandwidth) between the upper band line 178 and the lower band line 180 is approximately 0.001 MHOS. This relatively small band width separation indicates to an individual analyzing the results that the data points for the graph of the transformer winding characteristic signature 150 over the frequency range of approximately 2.7 MHz to approximately 5.0 MHz is reasonably valid and reliable.

The individual analyzing the results, upon consideration of section 162 (FIG. 5) which exhibits a transfer function coherence nearly equal to unity, and upon consideration of section 172 (FIG. 6) which indicates practically no separation between the upper band line 178 and the lower band line 180, may reasonably conclude that the data points associated with the graph of the transfer winding characteristic signature 150 (FIG. 4) is valid and reliable.

As noted above, the transfer function coherence graph 160 (FIG. 5) indicated that the data for the frequency range of approximately 2.7 MHz to approximately 5.0 MHz may have some degree of inaccuracy. However, this degree of inaccuracy may be acceptable given that a substantial portion of section 166 resided in a range of between 1.0 and 0.4. Furthermore, when viewed in consideration of the relative closeness of the upper band line 178 (FIG. 6) and the lower band line 180 shown in section 176 of the transfer function confident bands 170, an individual analyzing the results may reasonably conclude that overall, the data points on the graph of the transformer winding characteristic signature 150 (FIG. 4) are reasonably valid and reliable, and that any conclusions drawn based upon an analysis of section 156 (FIG. 4) will be reasonably valid.

Similarly, upon consideration of section 164 (FIG. 5) of the transfer function coherence graph 160 and upon consideration of section 174 of the transfer function confidence bands 178 and 180, an individual analyzing the results may reasonably conclude that the data points on the graph of the transformer winding characteristic signature 150 (FIG. 4) is reasonably valid and reliable over the frequency range of approximately 2.7 MHz to approximately 5.0 MHz. That is, even though there is some degree of separation between the upper band line 178 (FIG. 6) and the lower band line 180 over portions of section 174 that indicates the potential for some inaccuracy of the data points, the majority of the transfer function coherence data points in section 164 (which lie between a range of 1.0 and 0.8) tend to offset concerns about the inaccuracy of the data points.

G. Comparing Characteristic Signatures

One convenient method of comparing two characteristic signatures is to plot the two characteristic signatures over a frequency range of interest on a single graph. That is, the characteristic signature 150 (FIG. 4), calculated using data points collected during the current monitoring period, is compared with a previously calculated characteristic signature 190 (see FIG. 7). The previously calculated characteristic signature 190 may be based upon data points collected during a previous monitoring period. Or, the previously calculated characteristic signature 190 may be based upon a previous off-line testing of the transformer according to the testing process described in the copending application Ser. No. 09/848,861 entitled "SYSTEM AND METHOD FOR OFF-LINE IMPULSE FREQUENCY RESPONSE ANALYSIS TEST", which is entirely incorporated herein by reference. Or, the previously calculated characteristic signature 190 may be based upon a previous on-line testing process employed by an alternative embodiment of the on-line winding test unit 220 (FIG. 9) having a pulse/signal generator 240 (FIG. 10), described below.

Figure 7:
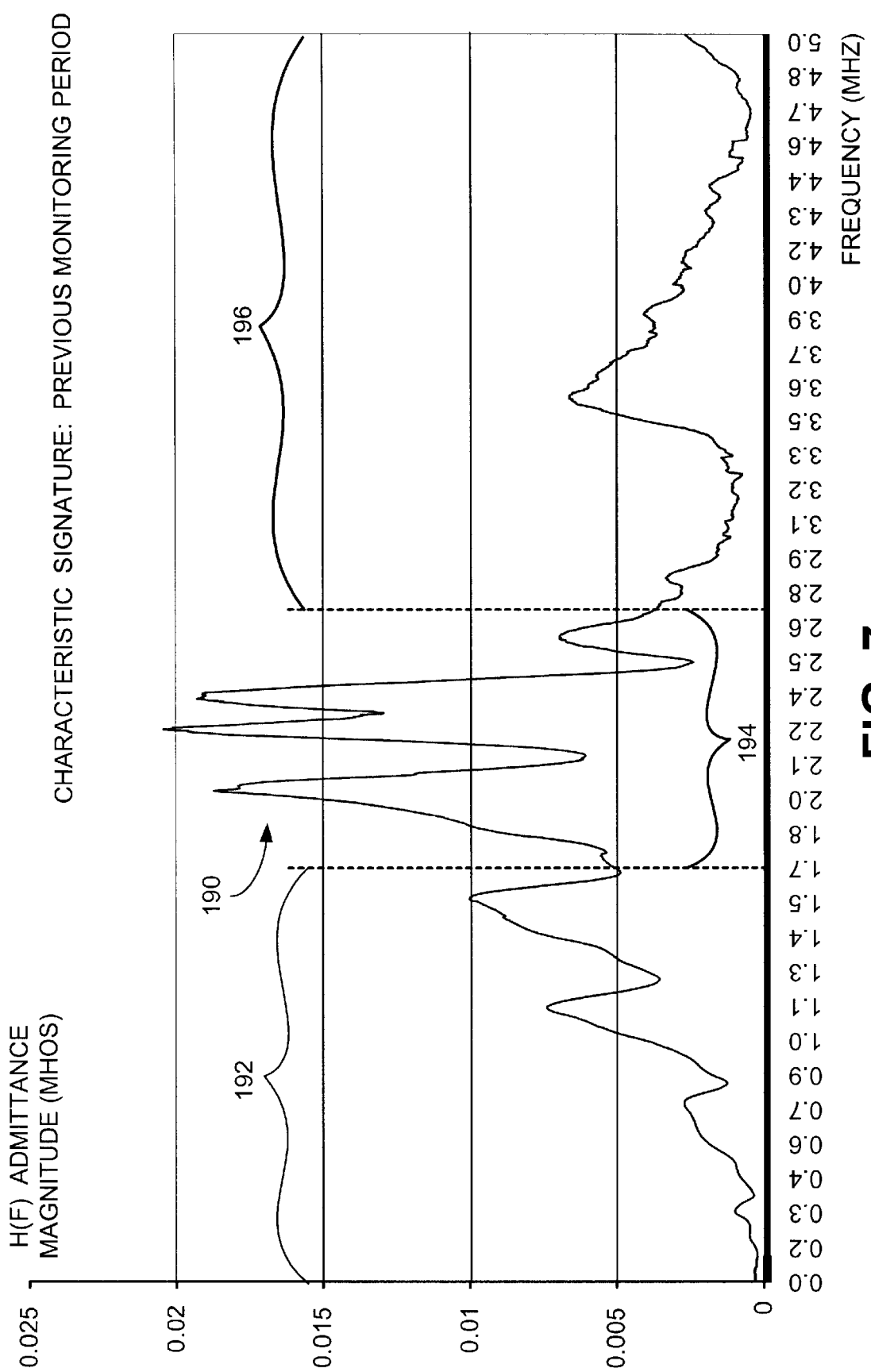
FIG. 7 is a graph of a previously calculated transfer function H(f) for the monitored winding.

FIG. 7 is a graph of a previously calculated characteristic signature 190, H(f), for the monitored energized winding. Characteristic signature 190 is graphed over a frequency range of approximately 3.0 kHz to approximately 5.0 MHz. For convenience of discussing a comparison of the characteristic signatures 150 (FIG. 4) and 190, the characteristic signature 190 is subdivided into three sections 192, 194 and 196. Section 192 corresponds to the transformer winding characteristic signature over the frequency range of approximately 3.0 kHz to approximately 1.7 MHz. The second section 194 corresponds to a frequency of approximately 1.7 MHz to approximately 2.7 MHz. The third section 196 corresponds to a frequency range of approximately 2.7 MHz to approximately 5.0 MHz.

Figure 8:
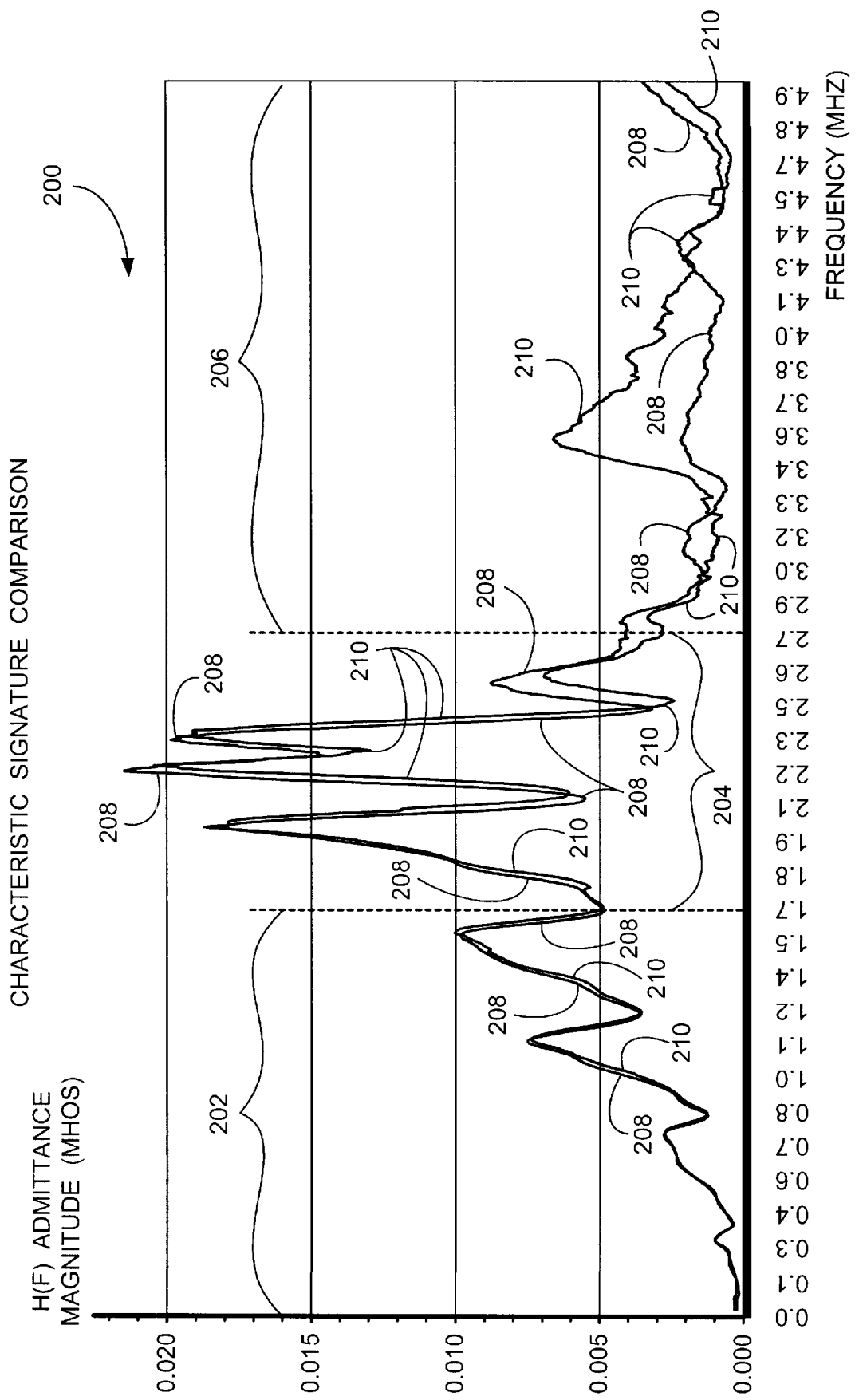
FIG. 8 is a graph of the transformer winding characteristic signature calculated using data points collected during the current monitoring period and a graph of the transformer characteristic signature calculated using data points collected during a previous monitoring period.

FIG. 8 is a graph 200 of the transformer winding characteristic signature 208 calculated using data points collected during the current monitoring period, and a graph of the transformer winding characteristic signature 210 calculated using data points collected during the previous monitoring period. The graph of the transformer winding characteristic signature 208 is substantially similar to the graph of the transformer winding characteristic signature 150 of FIG. 4. Similarly, the transformer winding characteristic signature 210 corresponds substantially with the transformer winding characteristic signature 190 of FIG. 7. Graph line of the characteristic signature 208 may differ from graph line of the characteristic signature 150, and graph line 210 may differ slightly from graph line 190, due to variations in the frequency axis scale and the admittance magnitude axis scale. For convenience, graph 200 is divided into three sections 202, 204 and 206.

Any significant differences between the two compared characteristic signatures, easily visible when plotted on the same graph, indicates possible deformation and/or displacement of the windings in the tested transformer. The individual analyzing the characteristic signatures, using experience and good engineering judgment, determines the probability of any winding deformation and/or displacement.

Considering the characteristic signatures 208 and 210, each known to be suitably valid and accurate using the coherence function and the random error function described above, track each other relatively closely, the individual analyzing the characteristic signatures could reasonably conclude that the probability of winding deformation and/or displacement was very low, and/or that any actual winding deformation and/or displacement present in the transformer were minimal and within acceptable tolerances expected to occur during normal transformer operating conditions. On the other hand, a wide variation between the characteristic signatures 208 and 210, at all or some frequencies, indicates a higher probability of transformer winding deformation and/or displacement.

Furthermore, the magnitude of the variation between the characteristic signatures 208 and 210 may be correlated with probability of winding deformation and/or displacement, and the magnitude/severity of winding deformation and/or displacement. In one embodiment, the individual analyzing the characteristic signatures would exercise experience and good engineering judgment to estimate the probability of and/or the extent of the winding deformation and/or displacement.

In another embodiment, the magnitude of the separation of the between the characteristic signatures 208 and 210 could be measured or sampled over the plotted frequency range, and numerically analyzed to calculate an indicator of the probability of and/or the extent of the winding deformation and/or displacement. For example, the separation of the between the characteristic signatures 208 and 210 could be integrated over a selected frequency range and the resultant number could be associated with a probability of and/or an extent of winding deformation and/or displacement.

In another embodiment, the number resulting from the integration of the separation magnitude over the selected frequency range could be compared with a predefined group of ranges, each range being associated with a probability of winding deformation and/or displacement. For convenience, each of the ranges may be associated with a color for ease of reporting results to the testing personnel or individual analyzing the characteristic signature. For example, the range associated with a low probability of winding deformation and/or displacement may print the numerical result, and/or a related message, in green (traditionally associated with an acceptable condition). The range associated with a high probability of winding deformation and/or displacement may print the numerical result, and/or a related message, in red (traditionally associated with a danger or warning condition). A range associated with an intermediate probability of winding deformation and/or displacement may print the numerical result, and/or a related message, in yellow or orange (traditionally associated with a caution condition). One skilled in the art will appreciate that the above-described three color indication system may be modified according to the specific needs of the testing personnel in that any suitable number of ranges could be selected and any suitable color could be associated with each of the selected ranges without departing substantially from the operation and functionality of the present invention. Any such alternative embodiment of a winding test unit in accordance with the present invention is intended to be within the scope of this disclosure and to be protected by the accompanying claims.

Once the individual analyzing the characteristic signatures 208 and 210 has assessed the probability of winding deformation and/or the extent of winding displacement, a recommended course of action may be determined. For example, an indication of low probability of winding deformation and/or displacement might indicate that the transformer was operating satisfactorily and had not been subjected to severe electrical or severe mechanical stresses that are likely to cause a transformer fault. An indication of a high probability of winding deformation and/or displacement might indicate a need to immediately remove the transformer from service and to repair the tested transformer. An indication of an intermediate probability of winding deformation and/or displacement might indicate a need for additional testing, more frequent monitoring and testing, or a visual inspection of the windings.

The data analysis process described above may be further enhanced by incorporating an analysis of the phase transfer function and the admittance transfer function of the test data. When comparing the phase transfer function and/or the admittance transfer function of the current monitoring period against the phase transfer function and/or the admittance transfer function of a previous monitoring period, relatively large variations between the phase transfer function and/or the admittance transfer function may indicate the presence of winding deformation and/or displacement, particularly if such relatively large variations between the phase transfer function and/or the admittance transfer function occur at the same or similar frequencies where the comparison of the characteristic signature indicates a significant change. One skilled in the art will appreciate that the consideration of such related tests, and other well known transformer testing techniques, when used in conjunction with the new characteristic signature of the transformer winding determined in accordance with the present invention, will enable the individual analyzing test results to more reliably predict the presence of and/or the severity of winding deformation and/or displacement, and the associated likelihood of transformer fault occurring in the future.

H. Alternative Embodiment Generating a Test Signal or Pulse

Figure 9:
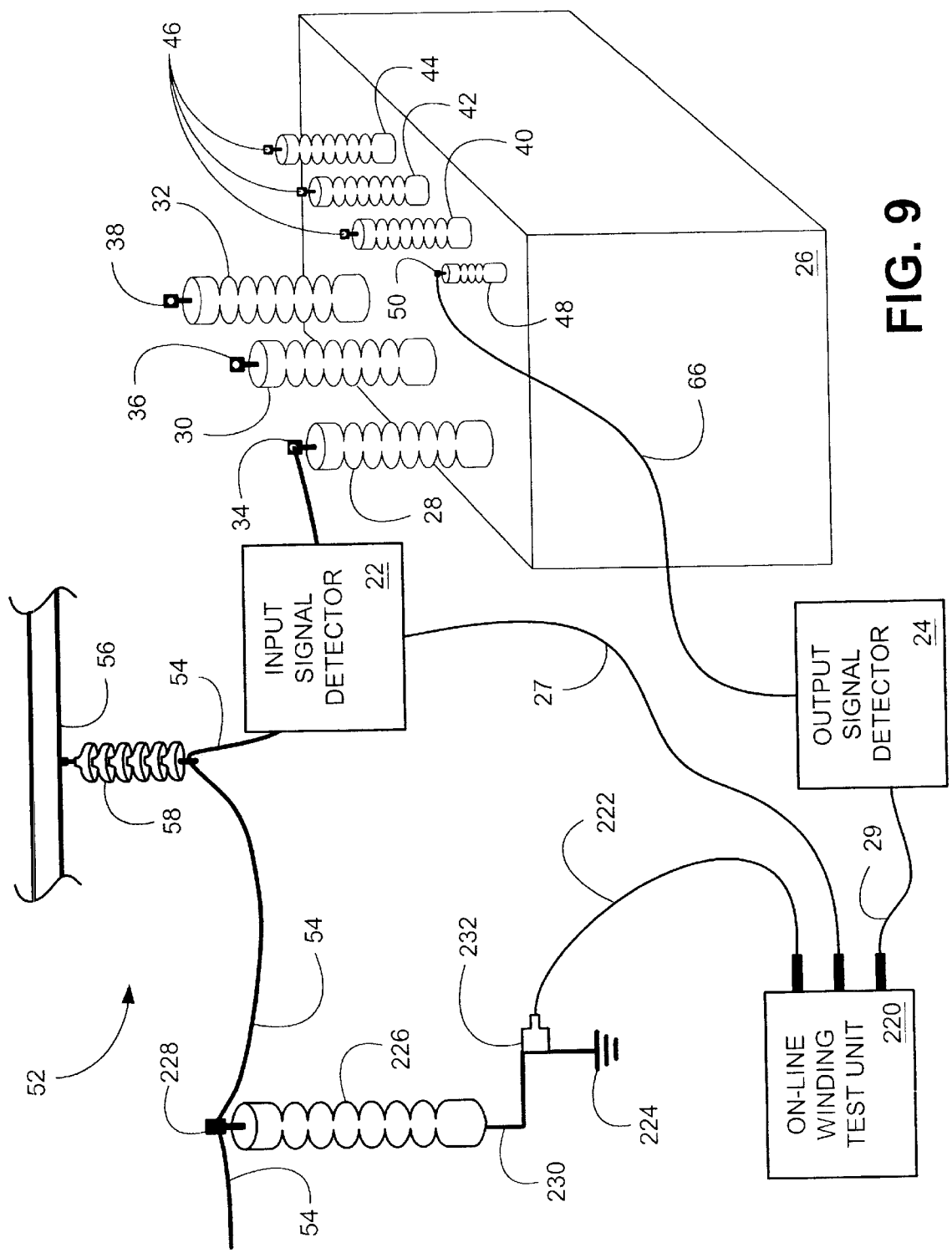
FIG. 9 illustrates an alternative embodiment of the on-line winding test unit coupled to the transformer of FIG. 1.

FIG. 9 illustrates an alternative embodiment of the on-line winding test unit 20 coupled to the transformer 26. Similar to the on-line winding test unit 20, an input signal detector 22 is coupled to the on-line winding test unit 220, via connection 27, to detect incoming pulses or signals. Also, an output signal detector 24 is coupled to the on-line winding test unit 220, via connection 29. The input signal detector 22 and the output signal detector 24, and the manner in which they are coupled to transformer 26, has been described above in detail and is not repeated herein for convenience.

The on-line winding test unit 220 further includes a connection to a suitable location on the high voltage portion 52 of the energy delivery system. As described below, the on-line winding test unit 220 is configured to generate a test pulse or signal. The generated pulse or signal is injected into the high voltage portion 52, via connection 222, such that the generated pulse or signal is applied to terminal 34 of the high voltage bushing 28. The applied signal or pulse is detected by the input signal detector 22, and the output pulse is detected by the output signal detector 24.

For convenience of illustration, the embodiment of the on-line winding test unit 220 illustrated in FIG. 9 employs a connection 222 coupled to a grounding point 224 on a lightning arrester 226. Lightning arrester 226 is coupled to conductor 54 at terminal 228 and is coupled to the grounding point 224 via connection 230. Lightning arrester 226, and its associated connections, are well known in the art. Therefore, the operation and functionality of the lightning arrester 226 is not explained in detail herein other than to the extent necessary to understand the operation of the lightning arrester 226 when coupled to the on-line winding test unit 220.

Alternative embodiments are configured to couple connection 222 to other convenient locations on the energy delivery system. For example, connection 222 could be coupled directly to conductor 54 with an appropriate coupling device. Alternatively, connection 222 could be coupled to a suitable and convenient location on another device already existing at the location site of transformer 26. Furthermore, connection 222 may be coupled to either the high voltage portion of the energy delivery system or the low voltage portion of the energy delivery system, depending upon which transformer winding is to be monitored. The above-described variations and modifications for the coupling of connection 222 to the energy delivery system may be made without departing substantially from the spirit and principles of the present invention so long as the on-line winding test unit 220 is capable of generating and injecting a suitable test signal or pulse such that suitable data points for the frequency bins are generated. It is intend that all such additional embodiments of the on-line winding test unit 220, and alternative means for coupling connection 222 to the energy delivery system, be included within the scope of this disclosure and be protected by the accompanying claims for the on-line winding test unit 220.

Connection 222 is coupled to connection 230 using a suitable connecting device or fastener 232. The pulse or signal generated by the on-line winding test unit 220 is injected into the high voltage portion 52 through connections 222, connection 230 and lightning arrester 226. The embodiment of the on-line winding test unit 220 is particularly suitable for an installation where a sufficient number of data points in the frequency bins are not typically available. Thus, a person operating the on-line winding test unit 220, hereinafter referred to as the testing personnel, may use the on-line winding test unit 220 to inject a suitable pulse or signal through the monitored winding (not shown) of transformer 26 such that data points may be generated. A suitable number of pulses or signals may be generated by the on-line winding test unit 220 so that a suitable number of data points in each frequency bin are collected.

Figure 10:
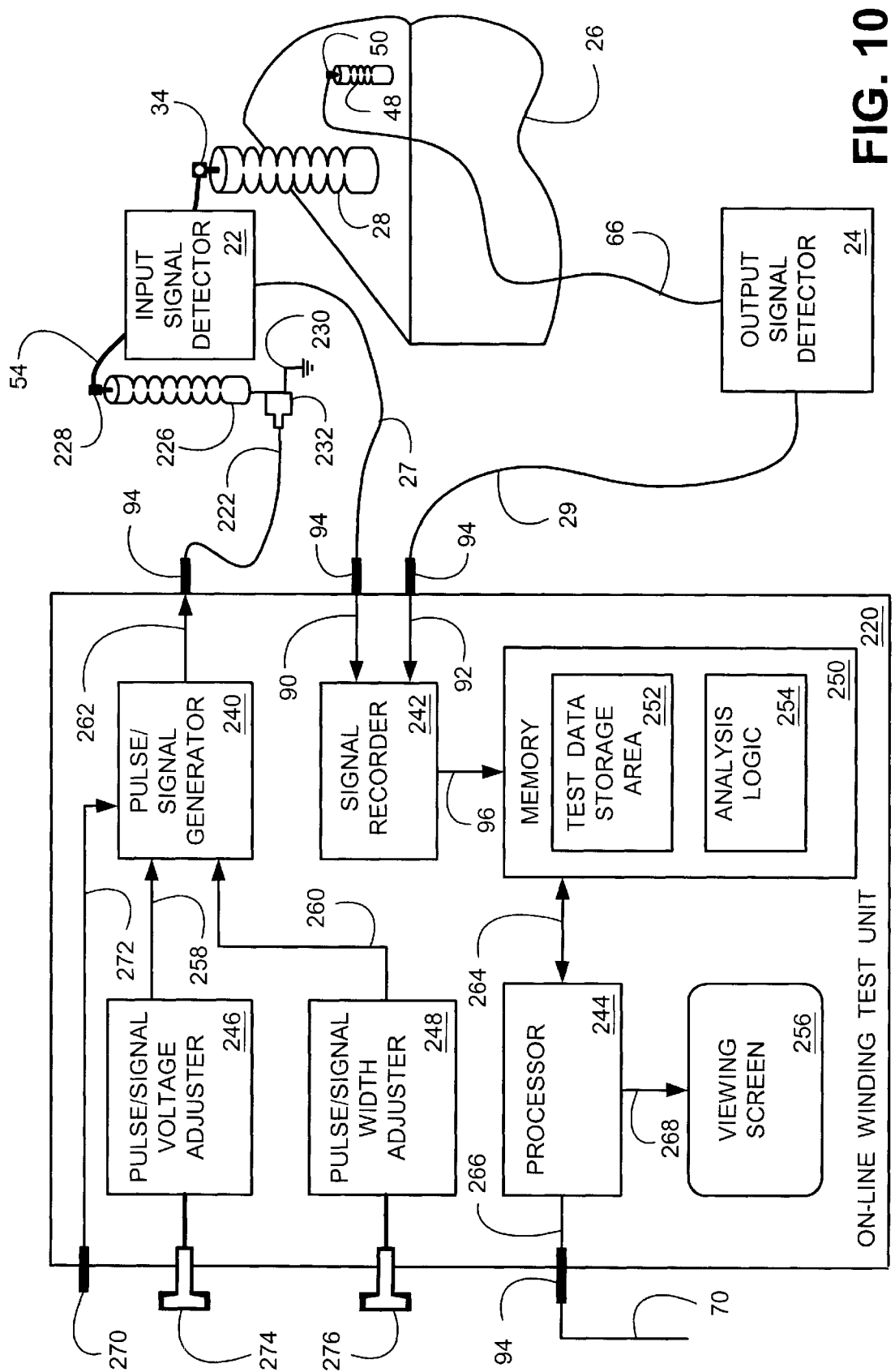
FIG. 10 is a block diagram illustrating selected components residing in the on-line winding test unit of FIG. 9.

FIG. 10 is a block diagram illustrating selected components residing in the on-line winding test unit 220. On-line winding test unit 220 includes at least a pulse/signal generator 240, a signal recorder 242, a processor 244, a pulse/signal voltage adjuster 246, a pulse/signal width adjuster 248 and a memory 250. Memory 250 includes a test data storage area 252 and the analysis logic 254. An optional viewing screen 256 is also included with the on-line winding test unit 220.

Pulse/signal generator 240 is configured to generate a pulse or signal. The magnitude of the pulse or signal generated by the pulse/signal generator 240 is specified by an input from the pulse/signal voltage adjuster 246, provided over connection 258, that specifies the peak voltage magnitude of the pulse or signal. The width of the pulse or signal generated by the pulse/signal generator 240 is determined by a signal from the pulse/signal width adjuster 248, over connection 260. Pulse/signal voltage adjuster 246 may be implemented using well known components and methods employed in the art of adjusting voltages. Similarly, pulse/signal width adjuster 248 may be implemented using well known components and methods employed in the art of adjusting the width of a pulse or signal. Detailed operation of individual components used in the pulse/signal voltage adjuster 246 and/or the pulse/signal width adjuster 248 are not described in detail herein, other than to the extent necessary to understand the operation and functioning of these components when employed as part of the on-line winding test unit 220. One skilled in the art will realize that the pulse/signal voltage adjuster 246 and the pulse/signal width adjuster 248 may be implemented using any one of a number of well known devices and that such devices are too numerous to conveniently describe in detail herein. Any such well known devices which adjust voltage magnitude and/or adjust the width of a pulse or signal may be implemented in an on-line winding test unit 220 without departing substantially from the functionality and operation of the present invention. Any such variations in an on-line winding test unit 220 which utilizes the system and method of the present invention to generate a pulse or signal having a suitable voltage and a suitable width are intended to be within the scope of this disclosure and to be protected by the accompanying claims.

Based upon the voltage specified by the pulse/signal voltage adjuster 246 and the width of the pulse or signal specified by the pulse/signal width adjuster 248, pulse/signal generator 240 is prompted to generate a pulse or signal onto connection 262. Connection 262 of the on-line winding test unit 220 is coupled to connection 222, thereby providing connectivity to terminal 34 of the high voltage bushing 28 on transformer 26 through the lightning arrester 226 and conductor 54. In one embodiment, connection 222 is configured to couple to connection 262 with a commonly available plug-in connector 94, described above. Alternatively, connection 222 is fixably attached to connection 262, thereby providing a secure connection to connection 262. Connection 222 employs a suitable fastener 232 so that connection 222 is easily and conveniently coupled to connection 230. Examples of a suitable fastener 232 include, but are not limited to, a clamp, a bolt, a clasp, a c-clamp, or a specially designed and fabricated terminal connector.

Signal recorder 242 receives data corresponding to the detected the pulse or signal generated by the pulse/signal generator 240, via the input signal detector 22. This pulse or signal is applied to terminal 34. Thus, an embodiment of the on-line winding test unit 220 employing connection 27 provides for the detection of the pulse or signal that is applied to terminal 34, thereby avoiding the influence of any distortions that may be introduced by lightning arrester 226 and/or conductor 54. An alternative embodiment directly detects the generated pulse or signal at an alternative convenient location, or directly from the pulse/signal generator 240. Signal recorder 242 transmits a suitable formatted data signal corresponding to the detected input and output pulses or signals to memory 250 for storage in the test data storage area 252.

Input signal detector 22 is coupled to terminal 34 of the high voltage bushing 28 as described above. Output signal detector 24 is coupled to terminal 50 of the neutral bushing 48 as described above. Signal recorder 242 is coupled to connection 27, via connection 90, with a connector 94, as described above. Similarly, signal recorder 242 is coupled to connection 29, via connection 92, with a connector 94, as described above. Pulse/signal generator 240 is coupled to connection 222, via connection 262, with a connector 94, as described above. Signal recorder 242 is coupled to memory 250 via connection 96 as described above.

Processor 244 is coupled to memory 250 via connection 264. Processor 244, as described hereinafter, accesses the analysis logic 254 residing in memory 250 and the recorded signals described above residing in the test data storage area 252 so that the detected input and output pulses or signals are allocated to the appropriate frequency bins in a manner described above. Processor output connection 266 is coupled to connection 70 so that a suitable output report may be provided to the testing personnel or output to other communications and/or analysis equipment. For convenience of illustration, connection 266 is coupled to connection 70 with a plug-in connector 94, described above. However, alternative embodiments may employ other types of connectors, or connection 266 may be fixably attached to connection 70, without departing substantially from the operation and functionality of the present invention.

Additionally, processor 244 is coupled to an optional viewing screen 256 via connection 268. The optional viewing screen 256 is used by the testing personnel to view the generated pulse or signal from pulse/signal generator 240, the signal corresponding to the detected output pulse or signal on terminal 50 of the neutral bushing 48, and/or the output reports generated by processor 244. The optional viewing screen 256 is particularly desirable in applications where the testing personnel desires to visually inspect the generated pulse or signal, the detect input pulse or signal, and/or the detected output pulse or signal. Viewing screen 256 may be any suitable device for displaying an output signal. For example, but not limited to, viewing screen 256 may be a cathode ray tube (CRT), a flat panel screen, a light emitting diode (LED) screen, liquid crystal display (LCD), or any other well known screen device. An on-line winding test unit 220 employing any suitable viewing screen embodiment is intended to be within the scope of this disclosure and protected by the accompanying claims.

Summarizing, when on-line winding test unit 220, input signal detector 22 and output signal detector 24 are coupled to transformer 26 as described above, a pulse or signal generated by pulse/signal generator 240 propagates through the transformer windings (not shown) and an output pulse or signal is detected by output signal detector 24. A signal corresponding to the generated input pulse or signal and a signal corresponding to the detected output pulse or signal is provided to signal recorder 242 for storage in the test data storage area 252 on memory 250.

As described above, pulse/signal generator 240 is prompted to generate a pulse or signal onto connection 262. The testing personnel using on-line winding test unit 220 prompts pulse/signal generator 240 to generate a pulse or signal onto connection 262 by actuating actuator 270. Actuator 270 provides a signal over connection 272 to the pulse/signal generator 240 such that the pulse/signal generator 240 generates the desired pulse or signal. Actuator 270 may be implemented using any suitable type actuating device configured to generate a signal that is suitable for prompting pulse/signal generator 240 generate the desired pulse or signal. Examples of actuator 270 include, but are not limited to, push button switches, single pull-single throw switches, touch pads, touch sensors or other similar devices that respond to command provided by the testing personnel. Any such well known actuator 270 may be implemented in an on-line winding test unit 220 without departing substantially from the functionality and operation of the present invention. Any such variations in the device used to implement actuator 270 in an on-line winding test unit 220 which utilizes the system and method of the present invention is intended to be within the scope of this disclosure and to be protected by the accompanying claims.

The testing personnel during the testing of transformer 26, as described in detail above, may elect to adjust the voltage of the pulse or signal generated by pulse/signal generator 240. An actuator 274, conveniently accessible from the outside of on-line winding test unit 220, is coupled to the pulse/signal voltage adjuster 246 so that the testing personnel may adjust the voltage of the generated pulse or signal. In one embodiment, actuator 274 is a control dial. However, actuator 274 may be any other suitable device which enables the testing personnel to actuate the pulse/signal voltage adjuster 246 such that the voltage of the pulse or signal generated by pulse/signal generator 240 is adjusted. For example but not limited to, actuator 274 could be implemented as a digital numeric entry system, a keypad device, or an appropriately configured switching device. Similarly, the testing personnel during testing of transformer 26 may elect to adjust the width of the pulse or signal generated by pulse/signal generator 240. Actuator 276 is coupled to the pulse/signal width adjuster 248 so that the pulse or signal width may be adjusted. Like actuator 274, in one embodiment actuator 276 is a control dial. However, actuator 276 may be implemented using the alternative devices like those described above for actuator 274.

I. Exemplary Pulse or Test Signal

Figure 11:
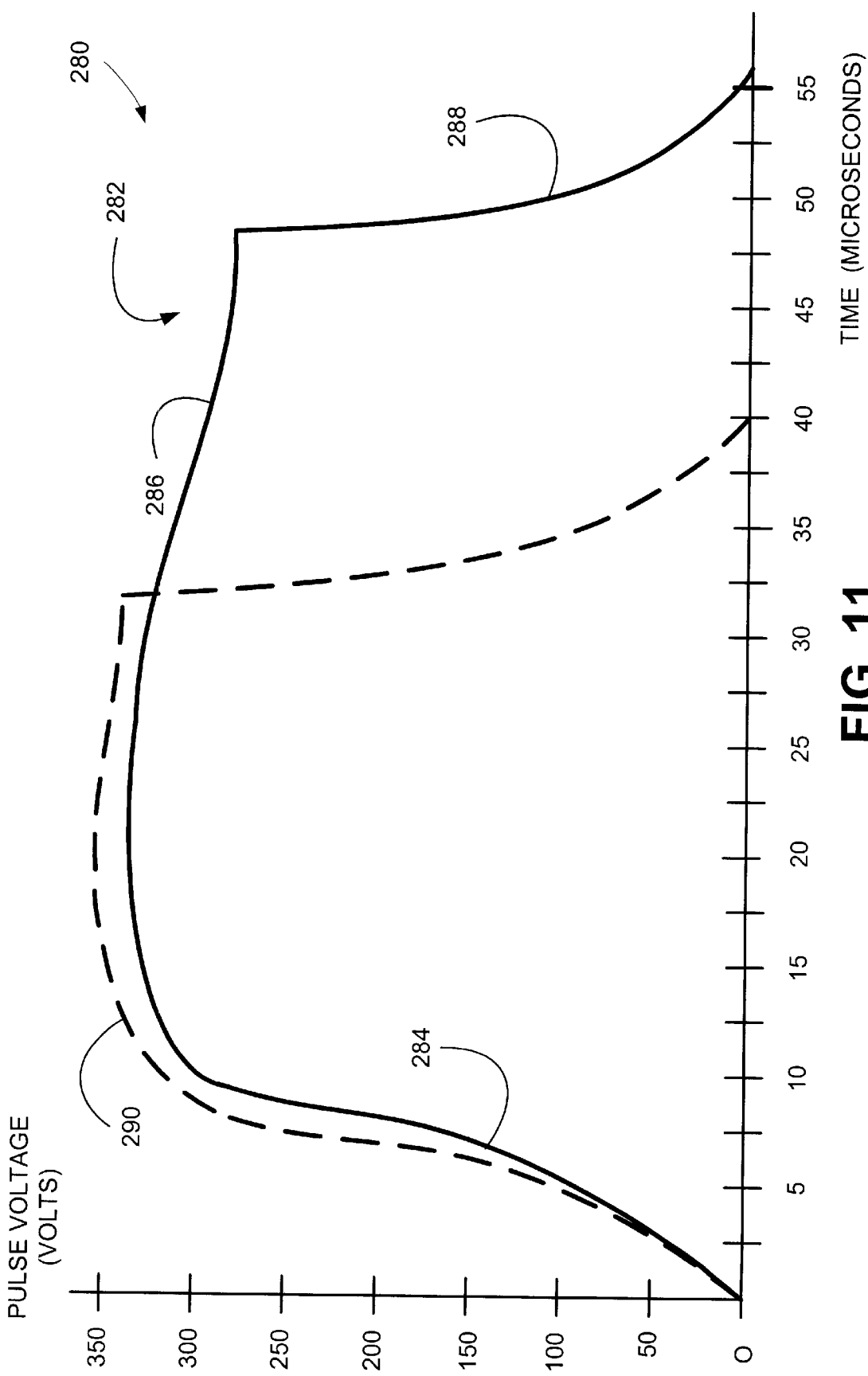
FIG. 11 is a graph showing two exemplary test pulses applied by the on-line winding test unit of FIG. 9.

FIG. 11 is a graph 280 showing two exemplary test pulses applied by the on-line winding test unit 220 (FIGS. 9 and 10) to a winding (not shown) residing in transformer 26. Such pulses are known as double exponential wave forms chopped on the tail. The first exemplary pulse 282 is illustrated by a solid line. Pulse 282 has a rise time illustrated by segment 284. Pulse 282 has a pulse width approximately equal to 45 microseconds, as illustrated by segment 286. At approximately 48 microseconds, the tail of pulse 282 is chopped such that the pulse quickly decays to 0 volts, as illustrated by segment 288. Pulse 282 is seen to have a peak pulse magnitude of approximately 325 volts.

The second pulse 290 is illustrated in FIG. 11 with a dashed line. Pulse 290 has a pulse width of approximately 35 microseconds and a peak magnitude of approximately 350 volts. Thus, pulse 290 is different from pulse 282 by both peak pulse magnitude and pulse width.

Pulses 282 and 290 illustrate that the on-line winding test unit 220 applies different pulses or signals to the tested transformer 26 (FIGS. 1 and 2). Furthermore, other characteristics of pulses 282 and 290 may be altered by on-line winding test unit 220 to produce pulses that differ from each other. For example, rise times and decay times of the pulses 282 and 290 may differ. Also, variations may be made in the pulse rise time, decay times, the time of the chop, the chop time and/or other various characteristics. One or several or any combination of the pulse parameters described above may be altered from one test pulse to the next. One skilled in the art will appreciate that any variety of suitable pulse or suitable signals may be generated by the on-line winding test unit 220 such that the input pulse or signal has sufficient energy to propagate through the tested windings, and such that the characteristics of the input pulse or signal are sufficient to provide a suitable output pulse or signal detectable at terminal 50 (FIGS. 9 and 10). Thus, the testing personnel performing the transformer test using on-line winding test unit 220 determines the appropriate voltage and pulse width of the input pulse or signal applied to the transformer windings such that a suitable output pulse or signal is detected. An alternative embodiment of the on-line winding test unit 220 is configured to automatically adjust the characteristics of the input pulse or signal, either randomly or by a predefined algorithm.

Also, the form of the input pulse or signal may be varied in a variety of manners so long as a suitable output pulse or signal is detected. For example, a triangular shaped signal, a stair-stepped shaped signal, a spiked signal, a square wave, a sinusoidal signal or a combination signal having portions of various signal types are used in alternative embodiments of the on-line winding test unit 220 (FIGS. 9 and 10). Furthermore, one skilled in the art will appreciate that the voltage and width of the exemplary pulses 282 and 290 illustrate exemplary test pulses employed by one embodiment of the on-line winding test unit 220.

In one embodiment, the input pulse or signal generated by pulse/signal generator 240 may be a fast rise double exponential current pulse into a predetermined length of the existing lightning arrester ground lead. This will cause a corresponding voltage pulse onto conductor 54 and into terminal 34 of the high voltage bushing 28 of the transformer 26. The pulse rise time, peak current, and tail time will be varied to achieve the suitable input pulse variation (energy and shape) into bushing connector 34 of transformer 26.

Thus, a suitable input pulse or signal generated by pulse/signal generator 240 may have forms, voltages and widths that are different from the exemplary pulses 282 and 290 so long as such alternative input pulses or signals propagate through the energized windings of transformer 26 so that a suitable input pulse or signal can be detected by input signal detector 22 (FIGS. 9 and 10) and so that a suitable output pulse or signal can be detected by output signal detector 24 (FIGS. 9 and 10).

Figure 12:
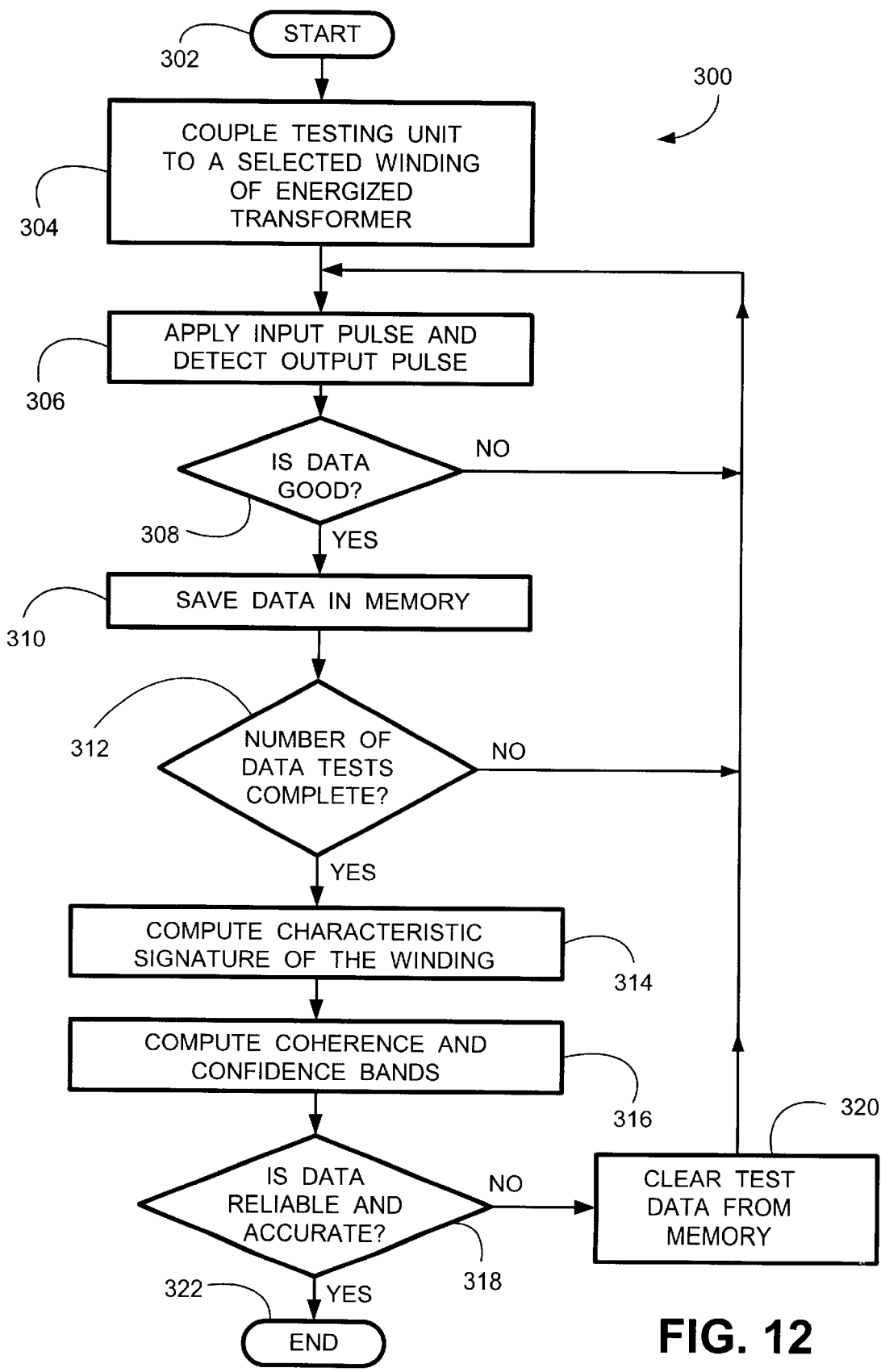
FIG. 12 is a flow chart illustrating an overview of the on-line winding testing process and method.

FIG. 12 is a flow chart 12 illustrating the operation of the on-line winding test unit 220 (FIGS. 9 and 10). The flow chart of FIG. 12 shows the architecture, functionality an operation of a possible implementation of the software for implementing the analysis logic 254 (FIG. 10). In this regard, each block may represent a module, segment or portion of code, which comprises one or more executable instructions for implementing the specified logical function (s). It should also be noted that in some alternative implementations, the functions noted in the blocks may occur out of the order noted in FIG. 12 or may include additional functions without departing significantly from the functionality of the on-line winding test unit 220. For example, two blocks shown in succession in FIG. 12 may in fact be executed substantially concurrently, the blocks may sometimes be executed in the reverse order, or some of the blocks may not be executed in all instances, depending upon the functionality involved, as will be further clarified hereinbelow. All such modifications and variations are intended to be included herein within the scope of this disclosure for the on-line winding test unit 220 and to be protected by the accompanying claims.

The process starts at block 302. At block 304, one embodiment of the on-line winding test unit 220 is coupled to a selected winding of the energized transformer 26 (FIGS. 9 and 10). Alternatively, another embodiment of the on-line winding test unit 220 may be already coupled to transformer 26, thus obviating the step shown in block 304. The testing personnel then prompts the on-line winding test unit 220 to generate an input pulse or signal such that the generated input pulse or signal is applied to the transformer 26 and such that an output pulse is detected.

Next, at block 308, a determination is made whether or not the data corresponding to the detected input pulse or signal, and the detected output pulse or signal, are good. If the data is not good (the NO condition), the data is discarded and the process returns to block 306. If the data is good (the YES condition), the data corresponding to the detected input pulse or signal, and the detected output pulse or signal, are saved in memory 250 (FIG. 10) at block 310. At block 312, the testing personnel determines whether or not a sufficient number of data tests have been completed. That is, the testing personnel determines whether or not a sufficient number of data points have been collected such that a reliable and accurate characteristic signature for the tested winding can be generated. If not (the NO condition), the process proceeds back to block 306 so that additional pulses or signals are generated by the on-line winding test unit 220. If a sufficient number of data tests have been completed (the YES condition), the process proceeds to block 314.

At block 314, processor 244 (FIG. 10) executes analysis logic 254 (FIG. 10) to compute the spectral densities and the characteristic signature of the winding. At block 316, processor 244 further executes analysis logic 254 to compute the coherence and confidence bands for the data points residing in the frequency bins. At block 318, a determination is made whether or not the data points in the frequency bins for H(f) are reliable and accurate. If not (the NO condition), the suspect H(f) is cleared from the data storage area 252 of memory 250 at block 320. The process then proceeds back up to block 306 so that additional test pulses or signals may be generated by the on-line winding test unit 220. However, if the data points residing in the frequency bins for H(f) are determined to be reliable and accurate (the YES condition, the process ends at block 322.

The above described process of generating and applying a test pulse or signal with the on-line winding test unit 220 (FIGS. 9 and 10) is substantially similar to the testing process described in greater detail in the co-pending and commonly assigned U.S patent application entitled "SYSTEM AND METHOD FOR OFF-LINE IMPULSE FREQUENCY RESPONSE ANALYSIS TEST", which is entirely incorporated herein by reference.

J. Other Alternative Embodiments

Figure 13:
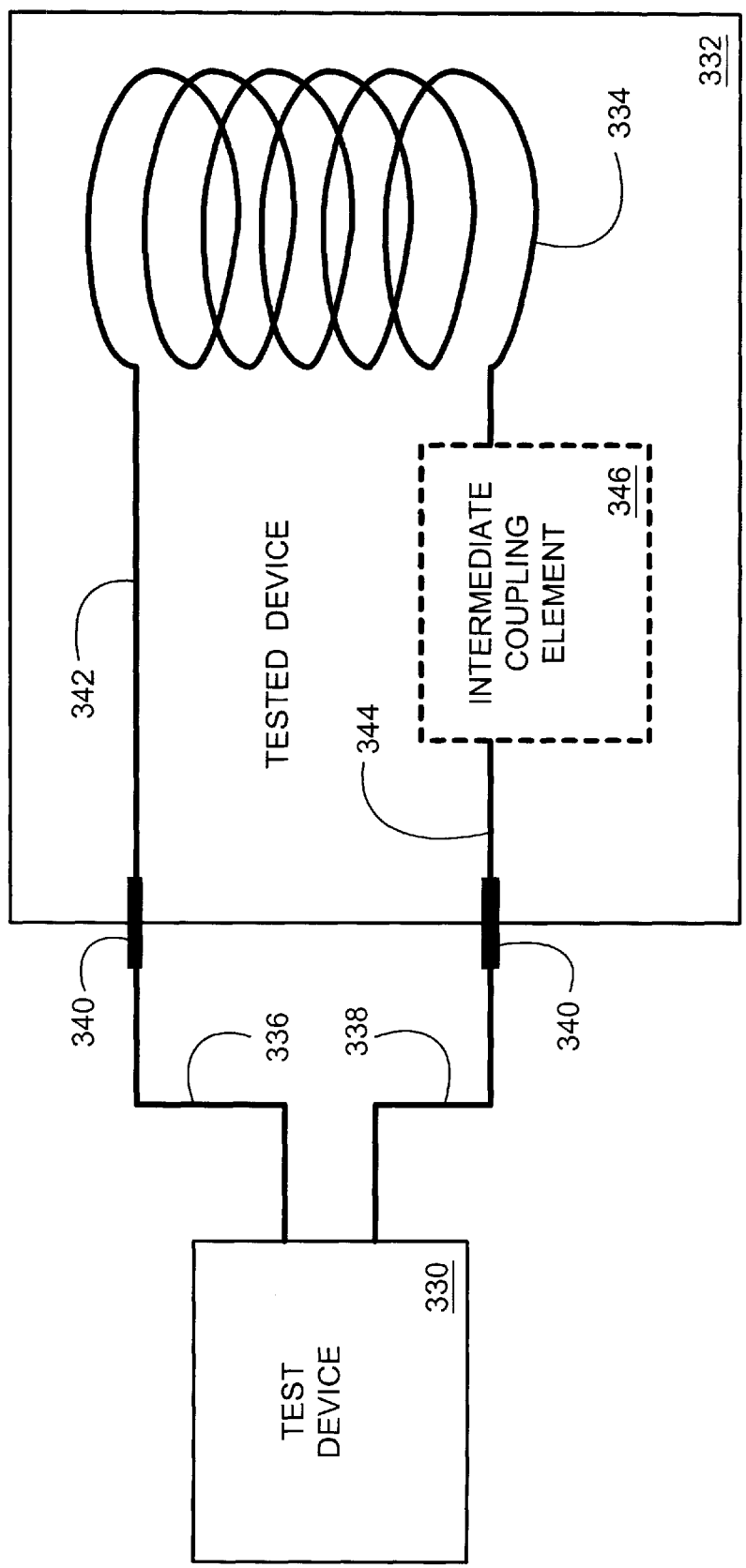
FIG. 13 illustrates an alternative embodiment of a testing unit coupled to a tested device having a winding that is to be tested for deformation or displacement.

The above-described embodiments of the on-line winding test unit 20 are described as an apparatus and method for determining a valid and reliable characteristic signature of the energized transformer windings residing in transformer 26. FIG. 13 illustrates an alternative embodiment of a testing device 330 coupled to a tested device 332 having at least one energized winding 334 that is to be tested for deformation or displacement. Testing device 330 is coupled to tested device 332 via connections 336 and 338. Suitable plug-in connectors 340 enable convenient coupling of connections 336 and 338 to connections 342 and 344, respectively.

Connection 342 is coupled to winding 334 such that an input pulse generated by testing device 330 may be applied to the winding 334, via connections 338 and 342. A suitable output pulse is detected by testing device 330 on connection 338. Testing device 330 generates an input pulse through winding 334 and detects an output pulse to derive a characteristic signature for winding 334. Thus, testing device 330 is configured in accordance with any of the above-described embodiments of the on-line winding test unit 20 (FIGS. 1 and 2) and/or on-line winding test unit 220 (FIGS. 9 and 10). For convenience of illustration, a sensing unit (not shown) is assumed to reside within testing device 330. However, such a sensing device (not shown) could reside outside of the testing device 330 as a stand-alone unit, or may be incorporated as part of a different multi-purpose device. Such alternative embodiments of the sensing element have been described above and are equally applicable to the embodiment illustrated in FIG. 13.

An intermediate coupling element 346 is shown residing within the tested device 332. Intermediate coupling element 346 may or may not be present depending upon the specific nature of the tested device 332. If the intermediate coupling element 346 is not present in the tested device 332, connection 344 would be directly coupled to winding 334.

Tested device 332 may be any device that employs a current carrying or voltage carrying winding as one of its elements. One example of such a tested device 332 is generator. Generators are commonly employed in the energy delivery system to generate electricity. Generators employ a plurality of windings coupled to the rotor and the stator. Thus, testing device 330 may be used to compute a characteristic signature of the winding(s) residing in the generator such that winding deformations or displacements may be detected. Another example of tested device 332 is the phase shifting transformer. Phase shifting transformers are devices employed in the energy delivery system to control the flow of power through individual transmission line or a group of transmission lines. A phase shifting transformer is constructed similar to a transformer, however, the phase shifting transformer is configured slightly differently such that control of power flow is achieved rather than the transformation of voltages. Another example of a tested device 332 having a winding is the voltage regulator. Voltage regulators are employed in an energy delivery system to automatically regulate voltage at a specific point in the energy delivery system. Another example of a tested device 332 includes some types of motors. Many motors employ windings such that when the motor windings are energized, the motor shaft is rotated so that the motor may perform a particular task or function. Simple devices such as potential transformers or current transformers employed in the energy delivery system to provide suitable inputs to current and voltage measuring devices may also be tested by testing device 330. The above-described examples of the tested device 332 are intended to demonstrate a few of the many devices that employ windings that may be tested by testing device 330. Any such embodiments of a testing device 330 configured to operate and function in accordance with the present invention are intended to be included within the scope of this disclosure and to be protected by the following claims.

Often, the tested device 332 will be constructed and configured such that connection 344 may not be directly coupled to the winding 334. For example, a second winding (not shown) may be electro-magnetically coupled to winding 334 such that the applied input pulse from the testing device 330 propagates through winding 334 and through the second winding (not shown). The second winding may provide a convenient connection 344 such that a suitable output pulse may be detected. Thus, the input pulse applied to winding 334 also propagates through the second winding and is detected on connection 344. Here, the characteristic signature determined by testing device 330 would be a characteristic signature that includes aspects of winding 334 and aspects of the second winding. Changes in the characteristic signal over time may indicate a deformation or displacement in winding 334 and/or the second winding. Thus, one skilled in the art will appreciate that testing device 330 may be particularly suited to detecting deformation or displacement in the windings of very complex devices. Any such embodiment of testing device 330 is intended to be included within the scope of this disclosure and to be protected by the accompanying claims.

The embodiment of the on-line winding test unit 220 illustrated in FIGS. 9 and 10 employed a pulse/signal voltage adjuster 246 such that the input pulse generated by the pulse/signal generator 240 could have an adjustable voltage. An alternative embodiment employs a pulse/signal current adjuster coupled to the pulse/signal generator 240 such that the current magnitude of the input pulse generated by the pulse/signal generator 240 is adjustable. Such an embodiment would be particularly suitable when the pulse/signal generator 240 was configured as a current source generating a current pulse. Any such alternative embodiment employing a pulse/signal current adjuster is intended to be included within the scope of this disclosure and to be protected the accompanying claims.

Another embodiment of the on-line winding test unit may be configured as a combination of the on-line winding test unit 20 (FIGS. 1 and 2) and the on-line winding test unit 220 (FIGS. 9 and 10). Such an alternative embodiment would be configured to detect pulses generated out on the energy delivery system that propagate through the monitored energized winding, and further configured to generate and apply test pulses or signals to the monitored energized winding. Such an alternative embodiment would be particularly advantageous when transformer 26 is located in an energy delivery system that is not subject to a sufficiently large number of pulses that are generated out on the energy delivery system.

Another alternative embodiment of the on-line winding test unit 20 (FIGS. 1 and 2) and/or the on-line winding test unit 220 (FIGS. 9 and 10) is configured to monitor a plurality of energized windings on transformer 26. For example, but not limited to, three input signal detectors 22 could be coupled to the high voltage A-phase, the high voltage B-phase and/or the high voltage C-phase of transformer 26. Also, concurrently or in another embodiment, three input signal detectors 22 could be coupled to the low voltage A-phase, the low voltage B-phase and/ or the low voltage C-phase of transformer 26. Such an alternative embodiment is particularly advantageous in monitoring more than one selected energized winding of the transformer 26. Such an embodiment of an on-line winding test unit would employ a signal recorder (similar to the signal recorder 82 of FIG. 2 and/or the signal recorder 242 of FIG. 10) that is configured to receive a plurality of signals from the plurality of input signal detectors 22.

An alternative embodiment detects incoming voltage pulses due to abrupt changes in current or voltage originating elsewhere on the energy delivery system, and/or applies a test pulse or signal, to other types of electrical apparatus that do not employ windings. The embodiment computes a characteristic signature according to the process of the present invention. For example, such an embodiment is particularly suitable to detecting structural changes in lightning arresters, capacitors, bushings and the like. Changes in characteristic signatures for such devices developed according to the present invention provide a useful predictive maintenance tool.

It should be emphasized that the above-described "embodiments" of the winding test unit, particularly, any "preferred" embodiments, are merely possible examples of implementations, merely set forth for a clear understanding of the principles of the winding test unit. Many variations and modifications may be made to the above-described embodiment(s) of the winding test unit without departing substantially from the spirit and principles of the winding test unit. All such modifications and variations are intended to be included herein within the scope of the winding test unit, and be protected by the claims that follow.

Therefore, the following is claimed:

1. A system for testing an energized winding, comprising:
   a first signal detector configured to detect a plurality of input signals applied to the energized winding;
   a second signal detector configured to detect a plurality of output signals, each one of the output signals corresponding to one of the input signals after the input signal has propagated through the energized winding;
   a processing means for performing the steps of:
      computing a plurality of auto-spectral densities based upon the detected input signal;
      computing a plurality of cross-spectral densities based upon the detected input signal and the detected output signal; and computing a characteristic signature for the energized winding such that the characteristic signature corresponds to the plurality of auto-spectral densities and the plurality of cross-spectral densities.

2. The system of claim 1, wherein the processing means is further configured to perform the steps of:
   comparing a plurality of portions of the characteristic signature with a predefined criteria; and
   accepting each one of the portions when the portion satisfies the predefined criteria.

3. The system of claim 2, wherein the predefined criteria is a predefined coherence value.

4. The system of claim 2, where the processing means is programmed for rejecting each one of the portions when the portion fails the predefined criteria.

5. The system of claim 2, wherein the processor means is programmed to perform the steps of:
   comparing each one of the portions with a second predefined criteria; and
   validating the characteristic signature when the number of portions at least equal to the second predefined criteria equals a predefined number.

6. The system of claim 3, wherein the second predefined criteria is a second predefined coherence value.

7. The system of claim 1, further comprising:
   a means for recording signals, the recording signal means coupled to the first signal detector and the second signal detector, the means for recording signals configured to receive the plurality of input signals from the first signal detector and configured to receive the plurality of output signals from the second signal detector, and further configured to generate an input data signal corresponding to each one of the input signals and configured to generate an output data signal corresponding to each one of the output signals; and
   a memory configured to store the input data signal and the output data signal, and further configured to provide the input data signal and the output data signal to the processor when the processor executes the logic.

8. The system of claim 1, the processor means further comprising a means for generating an output signal corresponding to the characteristic signature for the energized winding.

9. The system of claim 1, further comprising a means for generating a pulse onto the energized winding such that the pulse corresponds to the detected input signal.

10. A method for testing an energized winding, the method comprising the steps of:
    detecting a plurality of input signals and a plurality of output signals, the output signals propagating through the energized winding;
    computing a plurality of auto-spectral densities based upon each one of the detected input signals;
    computing a plurality of cross-spectral densities based upon each one of the detected input signals and the each one of the corresponding detected output signals;
    computing a characteristic signature for the energized winding such that the characteristic signature corresponds to the plurality of auto-spectral densities and the plurality of cross-spectral densities;
    comparing a plurality of portions of the characteristic signature with a predefined criteria; and
    accepting each one of the portions when the portion satisfies the predefined criteria.

11. The method of claim 10, further comprising the step of rejecting each one of the portions when the portion fails the predefined criteria.

12. The method of claim 10, wherein the predefined criteria is a predefined coherence value.

13. The method of claim 10, further comprising the steps of:
    comparing each one of the portions with a second predefined criteria; and
    validating the characteristic signature when the number of portions at least equal to the second predefined criteria equals a predefined number.

14. The system of claim 13, wherein the second predefined criteria is a second predefined coherence value.

15. The method of claim 10, further comprising the step of comparing the characteristic signature with a second characteristic signature for the energized winding, the second characteristic signature being computed at an earlier time, such that differences between the characteristic signature and the second characteristic signature indicate a deformation of at least one portion of the energized winding.

16. The method of claim 10, further comprising the step of comparing the characteristic signature with a second characteristic signature for the energized winding, the second characteristic signature being computed at an earlier time, such that differences between the characteristic signature for the energized winding and the second characteristic signature indicated a displacement of at least one portion of the energized winding.

17. The method of claim 10, further including the steps of:
    generating at least one signal; and
    applying the generated signal to the energized winding such that the generated signal corresponds to the input signal, and such that the generated signal is communicated through the energized winding and is detected as the output signal.

18. The method of claim 17, further comprising the step of adjusting at least one parameter associated with the generated signal.

19. The method of claim 18, wherein the step of adjusting adjusts the width of the generated signal.

20. The method of claim 18, wherein the step of adjusting adjusts the magnitude of the generated signal.

21. A system for testing an energized winding, comprising:
    means for detecting a plurality of input signals and a plurality of output signals, the output signals propagating through the energized winding;
    means for computing a plurality of auto-spectral densities based upon each one of the detected input signals;
    means for computing a plurality of cross-spectral densities based upon each one of the detected input signals and the each one of the corresponding detected output signals;
    means for computing a characteristic signature for the energized winding such that the characteristic signature corresponds to the plurality of auto-spectral densities and the plurality of cross-spectral densities;
    means for comparing a plurality of portions of the characterisitc signature with a predefined criteria; and
    means for accepting each one of the portions when the portion satisfies the predefined criteria.

22. The system of claim 21, further comprising means for rejecting each one of the portions when the portion fails the predefined criteria.

23. The system of claim 21, wherein the predefined criteria is a predefined coherence value.

24. The system of claim 21, further comprising:

means for comparing each one of the portions with a second predefined criteria; and means for validating the characteristic signature when the number of portions at least equal to the second predefined criteria equals a predefined number.

25. The system of claim 24, wherein the second predefined criteria is a second predefined coherence value.

26. The system of claim 21, further comprising means for comparing the characteristic signature with a second characteristic signature for the energized winding, the second characteristic signature being computed at an earlier time, such that differences between the characteristic signature and the second characteristic signature indicate a deformation of at least one portion of the energized winding.

27. The system of claim 21, further comprising means for comparing the characteristic signature with a second characteristic signature for the energized winding, the second characteristic signature being computed at an earlier time, such that differences between the characteristic signature for the energized winding and the second characteristic signature indicate a displacement of at least one portion of the energized winding.

28. The system of claim 21, further including:

means for generating a plurality of signals;

means for applying the generated plurality of signals to the energized winding such that the generated signal corresponds to the input signal, and such that the generated signal is communicated through the energized winding and is detected as the output signal.

29. The system of claim 28, further comprising means for adjusting at least one parameter associated with the plurality of signals.

30. The system of claim 29, wherein the means for adjusting adjusts the width of each one of the plurality of signals communicated through the energized winding.

31. The system of claim 29, wherein the means for adjusting adjusts the magnitude of each one of the plurality of signals communicated through the energized winding.

32. A system for testing an energized winding, comprising:

a first signal detector coupled to an input of the energized winding and configured to detect a plurality of input signals applied to the energized winding;

a second signal detector coupled to an output of the energized winding and configured to detect a plurality of output signals, each one of the output signals corresponding to one of the input signals after the input signal has propagated through the energized winding;

a processor configured to compute a plurality of auto-spectral densities based upon the detected input signal, compute a plurality of cross-spectral densities based upon the detected input signal and the detected output signal, and compute a characteristic signature for the energized winding such that the characteristic signature corresponds to the plurality of auto-spectral densities and the plurality of cross-spectral densities.

33. The system of claim 32, wherein the processor is further configured to compare a plurality of portions of the characteristic signature with a predefined coherence value and accept each one of the portions when the portion satisfies the predefined coherence value.

34. The system of claim 32, further comprising a memory configured to save the plurality of input signals from the first signal detector and configured to save the plurality of output signals from the second signal detector.

35. The system of claim 32, wherein the energized winding resides in a device that comprises at least one device selected from a group consisting of a transformer, a motor, a generator, a phase-shifting transformer and a voltage regulator.

* * * * *

UNITED STATES PATENT AND TRADEMARK OFFICE
CERTIFICATE OF CORRECTION

PATENT NO.     : 6,549,017 B2
DATED          : April 15, 2003
INVENTOR(S)    : Coffeen It is certified that error appears in the above-identified patent and that said Letters Patent is hereby corrected as shown below:

Column 1,
Line 13, delete "i" and replace with -- is --.
Line 18, delete "U.S" and replace with -- U.S. --.

Column 3,
Line 11, delete "loosing" and replace with -- losing --.

Column 5,
Lines 6-7, delete "trans-formers." and replace with -- trans-formers --.

Column 12,
Line 4, delete "Out" and replace with -- Output --.

Column 15,
Line 34, delete "incoporated" and replace with -- incorporated --.

Column 16,
Line 37, delete "FIGS." and replace with -- (FIGS. --.

Column 25,
Line 16, delete "intend" and replace with -- intended --.

Column 27,
Line 46, add -- to -- before the word "generate".

Column 29,
Line 23, delete "an" and replace with -- and --.

Column 30,
Line 17, delete "(the YES condition," and replace with -- (the YES condition), --.
Line 65, add the word -- a -- after the word "is".

UNITED STATES PATENT AND TRADEMARK OFFICE
CERTIFICATE OF CORRECTION

PATENT NO. : 6,549,017 B2
DATED : April 15, 2003
INVENTOR(S) : Coffeen

It is certified that error appears in the above-identified patent and that said Letters Patent is hereby corrected as shown below:

<u>Column 34,</u>
Line 10, delete "system" and replace with -- method --.

Signed and Sealed this

Fourteenth Day of October, 2003

JAMES E. ROGAN
*Director of the United States Patent and Trademark Office*